(12) United States Patent
Li et al.

(10) Patent No.: US 11,929,310 B2
(45) Date of Patent: Mar. 12, 2024

(54) RADIO FREQUENCY PACKAGES CONTAINING SUBSTRATES WITH COEFFICIENT OF THERMAL EXPANSION MATCHED MOUNT PADS AND ASSOCIATED FABRICATION METHODS

(71) Applicant: NXP USA, Inc., Austin, TX (US)

(72) Inventors: Lu Li, Gilbert, AZ (US); Lakshminarayan Viswanathan, Phoenix, AZ (US); Freek Egbert van Straten, Mook (NL)

(73) Assignee: NXP USA, Inc., Austin, TX (US)

( * ) Notice: Subject to any disclaimer, the term of this patent is extended or adjusted under 35 U.S.C. 154(b) by 202 days.

(21) Appl. No.: 17/546,453

(22) Filed: Dec. 9, 2021

(65) Prior Publication Data
US 2023/0187325 A1    Jun. 15, 2023

(51) Int. Cl.
| | | |
|---|---|---|
| H01L 23/495 | (2006.01) |
| H01L 23/057 | (2006.01) |
| H01L 23/31 | (2006.01) |
| H01L 23/00 | (2006.01) |
| H01L 25/00 | (2006.01) |
| H01L 25/16 | (2023.01) |

(52) U.S. Cl.
CPC ...... *H01L 23/49568* (2013.01); *H01L 23/057* (2013.01); *H01L 23/49503* (2013.01); *H01L 23/49513* (2013.01); *H01L 23/49575* (2013.01); *H01L 23/49582* (2013.01); *H01L 23/3121* (2013.01); *H01L 23/49562* (2013.01); *H01L 24/05* (2013.01); *H01L 24/32* (2013.01); *H01L 24/46* (2013.01); *H01L 24/73* (2013.01); *H01L 24/83* (2013.01); *H01L 25/16* (2013.01); *H01L 25/50* (2013.01); *H01L 2224/32227* (2013.01); *H01L 2224/73265* (2013.01); *H01L 2924/014* (2013.01)

(58) Field of Classification Search
CPC ......... H01L 23/49568; H01L 23/49513; H01L 23/49575; H01L 23/49582; H01L 23/49503; H01L 23/057; H01L 2924/014; H01L 24/26; H01L 24/05; H01L 24/83
See application file for complete search history.

(56) References Cited

U.S. PATENT DOCUMENTS

| | | |
|---|---|---|
| 7,083,759 B2 | 8/2006 | Osada et al. |
| 7,671,467 B2 | 3/2010 | Nonaka et al. |
| (Continued) | | |

*Primary Examiner* — Alonzo Chambliss

(57) ABSTRACT

Radio frequency (RF) packages containing substrates having coefficient of thermal expansion (CTE) matched mount pads are disclosed, as are methods for fabricating RF packages and substrates. In embodiments, the RF package contains a high thermal performance substrate including a metallic base structure, which has a frontside facing a first RF power die and a first die attach region on the frontside of the base structure. A first CTE matched mount pad is bonded to the metallic base structure and covers the first die attach region. The first CTE mount pad has a CTE greater than the CTE of RF power die and less than the CTE of the metallic base structure. An electrically-conductive bonding material attaches the RF power die to the first CTE matched mount pad, while RF circuitry integrated into first RF power die is electrically coupled to the metallic base structure through the mount pad.

19 Claims, 10 Drawing Sheets

(56) References Cited

U.S. PATENT DOCUMENTS

| | | | |
|---|---|---|---|
| 7,745,914 B2 | 6/2010 | Miyauchi | |
| 7,951,467 B2 | 5/2011 | Tsushima | |
| 9,559,026 B2 | 1/2017 | Xiong et al. | |
| 9,922,894 B1 * | 3/2018 | Viswanathan | H01L 23/047 |
| 9,984,951 B2 | 5/2018 | Viswanathan | |
| 10,347,559 B2 | 7/2019 | Fan et al. | |
| 11,128,268 B1 * | 9/2021 | Kishore | H01L 23/047 |
| 11,616,040 B2 * | 3/2023 | Sun | H01L 24/29 257/741 |
| 2019/0043774 A1 * | 2/2019 | Sanchez | H01L 21/56 |
| 2019/0051571 A1 * | 2/2019 | Sanchez | H01L 21/4842 |
| 2019/0109060 A1 * | 4/2019 | Sanchez | H01L 23/047 |
| 2020/0290316 A1 | 9/2020 | Cho et al. | |
| 2021/0020595 A1 * | 1/2021 | Sun | H01L 24/05 |
| 2021/0167033 A1 * | 6/2021 | Sun | C25D 5/615 |
| 2021/0233871 A1 * | 7/2021 | Kaizu | H01L 23/36 |

\* cited by examiner

RADIO FREQUENCY PACKAGES CONTAINING SUBSTRATES WITH COEFFICIENT OF THERMAL EXPANSION MATCHED MOUNT PADS AND ASSOCIATED FABRICATION METHODS

TECHNICAL FIELD

Embodiments of the present disclosure relate generally to microelectronics and, more particularly, to radio frequency (RF) packages containing substrates having coefficient of thermal expansion (CTE) matched mount pads, as well as to methods for fabricating such RF packages and substrates.

ABBREVIATIONS

Abbreviations appearing relatively infrequently in this document are defined upon initial usage, while abbreviations appearing more frequently in this document are defined below:
CTE—coefficient of thermal expansion;
Cu—copper;
GaN—gallium nitride;
IC—integrated circuit;
MN—matching network;
Mo—molybdenum;
PA—power amplifier;
PCB—printed circuit board; and
RF—radio frequency.

BACKGROUND

A microelectronic RF package contains radio frequency circuitry, which may be implemented utilizing one or more RF power dies. Examples of RF packages include power amplifier packages containing RF power dies, which bear transistor-containing ICs utilized for RF signal amplification purposes. Such RF power dies are often prone to excess heat generation when operated at higher power levels or frequencies and when fabricated utilizing power dense die technologies including, for example, layered GaN materials. To dissipate excess heat generated during RF package operation, a given RF power die may be mounted to a monolithic metallic (e.g., Cu) body, such as a metallic base flange or a metallic coin embedded in a PCB, utilizing solder or another bonding material. This provides a low thermal resistance path extending from the RF power die to a thermal interface accessible from the package exterior. When the RF package is mounted to a system-level PCB, such as a motherboard, a system-level heatsink (e.g., a metal chassis or fin array) may be placed in thermal communication with the thermal interface of the RF package, whether through direct contact or by bonding with a thermally-conductive material. During RF package operation, excess heat generated by the RF power dies is extracted from the RF package interior, conducted to the system-level heatsink, and ultimately convectively transferred to the surrounding environment to maintain peak temperatures of the RF power dies within acceptable limits.

BRIEF DESCRIPTION OF THE DRAWINGS

At least one example of the present invention will hereinafter be described in conjunction with the following figures, wherein like numerals denote like elements, and.

Figure 1:
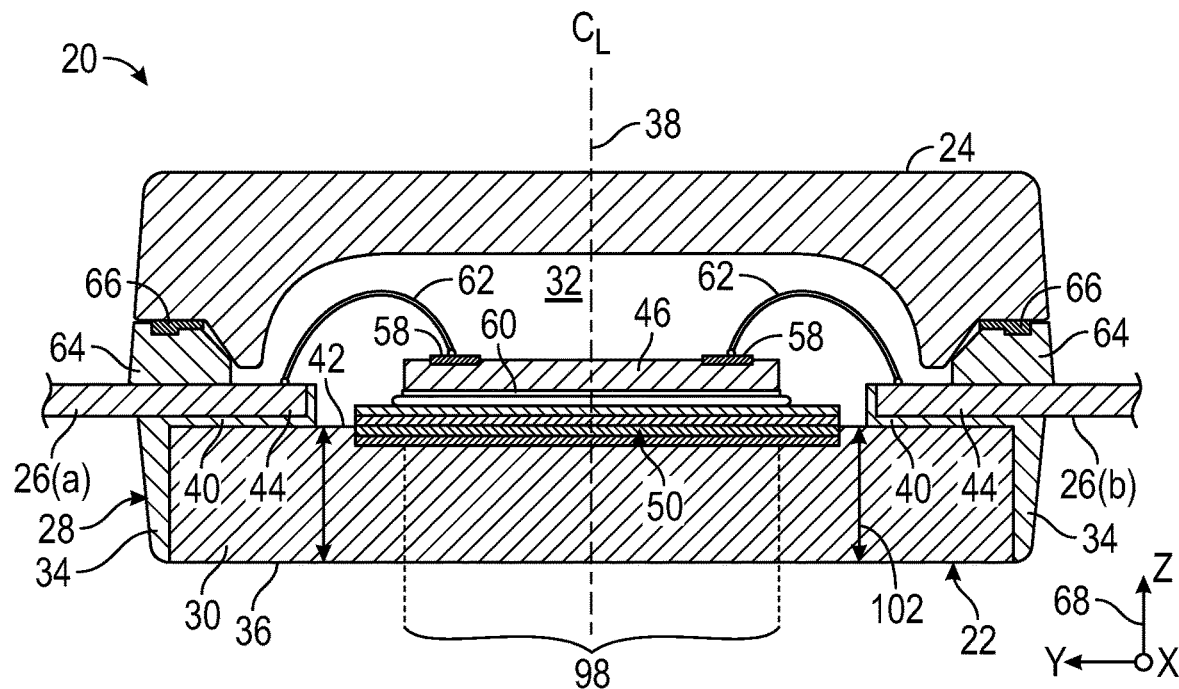
FIGS. 1 and 2 are cross-sectional and cross-sectional isometric views, respectively, of an RF package (here, an air cavity PA package) containing RF power dies and a high thermal performance (HTP) substrate having CTE matched mount pads to which the RF power dies are attached, as illustrated in accordance with an example embodiment of the present disclosure.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

As appearing herein, the term "metallic" refers to a material principally composed of one or more metals, by weight, and potentially containing lesser amounts of any number and type of metallic or non-metallic constituents. Similarly, reference to a layer, structure, or other feature as composed of a named metal (or metals) indicates that the layer, structure, or other feature is principally composed of the named metal (or metals) by weight. For example, reference to a copper (Cu) layer indicates that the named layer is predominately composed of Cu, by weight, but may contain lesser amounts of metallic or non-metallic constituents. Similarly, reference to a material composed of copper-molybdenum (Cu—Mo) indicates that the material is predominately composed of a combination of Cu and Mo, by weight. All numerical references to the coefficient of thermal expansion (CTE) of a material or a structure, as appearing in this document, denote linear CTEs and are expressed in terms of $10^{-6}$ meter/meter per degree Celsius.

As further appearing herein, statements indicating that a first layer is "bonded to," "formed over," or "formed on" a second layer (or surface) do not require that the first layer is directly bonded to and intimately contacts the second layer (or surface) unless otherwise expressly stated. Such statements thus do not preclude the possibility that one or more intervening layers may be present between the first layer (or surface) and the second layer (or surface). Generally, in this regard, the terms "over" and "on" do not require direct contact between a first layer formed "over" or "on" a second layer (or a surface), unless otherwise indicated by an express statement to this effect; e.g., a statement indicating that the first layer is formed "directly on" or "in contact with" the second layer (or surface). Further, the terms "over" and "on," as appearing throughout this document, are without restriction as to orientation within a larger three dimensional context. Accordingly, a first layer located beneath a second layer may be described as "formed over" the second layer when the first layer is deposited on, grown on, or otherwise created on the second layer.

Overview

As briefly described above, RF package architectures containing RF power dies mounted to metallic bodies or structures provide enhanced thermal performance by more efficiently dissipating excess heat generated during package operation. In one such RF package architecture, each RF power die contained with the RF package is mounted to a monolithic metallic body, such as a single piece of Cu or another metal having a substantially homogenous composition, utilizing solder or another thermally-conductive bonding material. This creates a low thermal resistance path extending from the RF power die, through the monolithic metallic body, and to a thermal interface exposed along the backside of the RF package; the term "backside," as appearing herein, referring to a primary exterior surface of an RF package located closer to the package substrate (e.g., a PCB or base flange) than is an opposing "topside" surface of the RF package, as taken in a package height or thickness direction. Examples of such monolithic metallic bodies include metallic coins or slugs, which are composed entirely of Cu (that is, an alloy containing Cu as its primary constituent) and which are embedded in electrically-routed substrate (e.g., a PCB) about which the RF package is constructed. Alternatively, such a monolithic metallic body can assume the form of a larger metallic base flange, which is uniformly composed of a single material (e.g., Cu) and which lacks electrical routing features. Metallic base flanges of this type are commonly incorporated into air cavity and overmolded (encapsulated) packages and may serve as both a heatsink and a terminal of the RF package. As a still further example, an RF power die may be attached to a monolithic metallic body in the form of a metallic block similar to a base flange, but provided in a leadframe format (herein, a "die attach pad"). The leadframe also includes other metallic portions, which are overmolded, separated via singulation, and ultimately define the contacts of the RF package when fabricated as, for example, a flat no-lead or land grid array (LGA) package.

While providing enhanced heat dissipation capabilities, the above-described RF package architectures (RF packages in which RF power dies are attached to monolithic metallic bodies) are associated with limitations. Such limitations often stem from disparities between the respective CTEs of the RF power dies contained within a given RF package and the CTE of the monolithic metallic body or bodies to which the RF power dies are mounted. Such disparities in CTEs (herein, the "die-substrate CTE mismatch") can be significant and are typically of greater concern in the context of RF packages containing RF power dies operated at higher power levels, at higher frequencies, or fabricated utilizing power dense die substrates, such as layered GaN substrates. In such cases, significant quantities of heat may be generated by a given RF power die during package usage, with such heat quantities conductively transferred to the underlying substrate and, specifically, to the monolithic metallic body to which the RF power die or dies are attached. Marked disparities in thermal growth may consequently occur between RF power die and the monolithic metallic body (e.g., Cu coin, base flange, or die attach pad), which may have a CTE exceeding that of the RF power die by a factor of about 3 or more. If not adequately addressed, mechanical stressors arising from such disparities in thermal growth can result in varying degrees of structural compromise over time and across repeated thermal cycling, which may ultimately degrade the overall electrical and thermal performance of the RF package. To provide a specific, albeit non-limiting example, carrier PA dies contained in Doherty PA architectures may be particularly vulnerable to issues arising from die-substrate CTE mismatches given that such dies tend to operate in an ON state with greater frequency than do the associated peaking transistor dies, as further discussed below in connection with FIG. 6.

To help address the above-described issues stemming from die-substrate CTE mismatch, industry efforts have been expended to develop and commercially introduce metallic base flanges having reduced CTEs, while retaining relatively high thermal conductivities, relatively high electrical conductivities, and other favorable characteristics. This may be accomplished by imparting a metallic base flange with a laminate or multilayer construction rather than a monolithic construction of the type as previously described. Metallic base flanges of this type (herein, "multilayer flanges") typically include three or more flange layers, with are bonded in a vertically stacked or laminated relationship. For example, a multilayer flange may include multiple layers composed of a first metallic material (e.g., Cu) having a first CTE, and at least one additional layer composed of a different metallic material (e.g., Mo or Cu—Mo) having a second CTE lower than the first CTE. The layers of the multilayer flange may be bonded together utilizing, for example, solder, a sintered material, or a similar bonding material. Through the incorporation of a multilayer flange into a given RF package, die-substrate CTE mismatches may be reduced to alleviate mechanical stressors at the die-substrate interface. This, in turn, may minimize the likelihood of structural compromise at die-substrate interface across repeated thermal cycling of the RF package to improve overall package reliability.

While providing the above-described benefits, the integration of multilayer flanges into RF packages, as conventionally designed and manufactured, remains associated with certain tradeoffs. The incorporation of a multilayer flange into a given RF package can increase manufacturing costs due to the cumulative volume of costly materials contained within the multilayer flange, as well as greater expenses incurred during manufacture of the multilayer flange itself. Conventional multilayer flanges may also be undesirably susceptible to variations in dimensional properties, such as variations in flange flatness due to warping, during high temperature processing. When supporting multiple RF power dies and possibly other heat-generating microelectronic components, a given multilayer flange typically provides uniform heat removal from all supported microelectronic components at essentially equivalent rates. As a corollary, it is typically impractical or infeasible to tailor conventional multilayer flanges to provide a lower thermal resistance paths from selected RF power dies, while providing somewhat higher thermal resistance paths from other microelectronic packages (e.g., other RF power dies) within a given RF package. Finally, and as a more general limitation, conventional multilayer flanges are often poorly suited for, if not incapable of integration into many common types of RF packages, including RF packages fabricated utilizing electrically-routed substrates (e.g., PCBs) and RF packages (e.g., flat no-lead or LGA packages) fabricated utilizing leadframe-based manufacturing approaches. For at least these reasons, there exists an ongoing industrial demand for enhanced RF package substrates suitable for integration into a wide range of RF package types, while supporting efficient heat extraction from packaged RF power dies and further minimizing die-substrate CTE mismatch. Ideally, such package substrates would also provide other benefits, such as relatively high levels of design flexibility, a decreased likelihood of undesired changes or variations in dimensional characteristics (e.g., flatness), and an amenability towards cost effective manufacture processes.

In satisfaction of the above-described industrial demand, the present document discloses microelectronic RF packages containing unique, high thermal performance substrates to which RF power dies are mounted. As indicated by the descriptor "high thermal performance," the presently-disclosed high thermal performance (HTP) substrates support highly efficient heat removal from packaged RF power dies, while reducing CTE mismatch between the RF power dies and the corresponding regions of the HTP substrate to which the dies are mounted; herein, the "die attach regions" of the HTP substrate. Embodiments of the HTP substrate include a metallic base structure to which one or more CTE matched mount pads are joined through diffusion bonding or utilizing a thermally-conductive bonding material, such as a solder, braze, or sintered material. The mount pads are "CTE matched" in the sense that a given mount pad is imparted with a CTE less than that of the metallic base structure and greater than that of the particular RF power die or dies attached to the mount pad utilizing a thermally-conductive (and often electrically-conductive) bonding material. In effect, a given CTE matched mount pad serves as an intermediary CTE structure or bridge to buffer the die attach interface from disparities in thermal growth that may otherwise occur in conjunction with thermal cycling of the RF package if the heat-generating RF power dies were directly mounted to the metallic base structure. The overall reliability of the RF package is enhanced as a result, while the RF package maintains optimized thermal performance characteristics to efficiently dissipate excess heat generated by the RF power dies contained within the RF package. Additionally, in embodiments in which the HTP substrate serves as a terminal of the RF package, such as when the RF package assumes the form of a PA package containing one or more PA dies having terminals electrically coupled to the metallic base structure, the HTP substrate may further provide a low electrical resistance path extending from the PA dies, through the CTE matched mount pads, and to the metallic base structure.

The CTE matched mount pads incorporated into the HTP substrate serve as localized foundational structures providing the desired CTE matching function, as just described. Not only may this reduce the susceptibility of the HTP substrate to dimensional irregularities relative to conventional multilayer flanges, such as variations in substrate flatness due to warping, the HTP substrate may be designed to provide highly tailored thermal tuning optimizing heat dissipation from different RF power dies (or other substrate-supported components) within an RF package by, for example, variations in the volume and/or composition of a given CTE matched mount pad. For example, in implementations in which a given RF package assumes the form of a Doherty PA package containing at least one peaking PA die and a carrier PA die, the carrier PA die (e.g., having a greater propensity for heat generation) may be mounted to a first CTE matched mount pad fabricated to possess a greater volume and/or a higher thermal conductivity, while the peaking PA die is mounted to a second CTE matched mount pad possessing a lesser volume and/or a lower thermal conductivity than does the first CTE matched mount pad. Alternatively, in such embodiments, the carrier PA die may be mounted to a CTE matched mount pad, while the peaking PA die is mounted directly to the metallic base structure. As a still further possibility, the carrier and peaking PA dies may be mounted to a single, more expansive CTE matched mount pad or alternatively mounted to separate CTE matched mount pads having similar, if not substantially identical volumes and thermal conductivities. Embodiments of the HTP substrate may also provide an increased heat spreading functionality when, for example, the CTE matched mount pad or pads cooperate with the metallic base structure to form low thermal resistance, inverted T-shaped structures, which are embedded in a dielectric substrate (e.g., a PCB) in a coin-like manner and which increase in volume when moving away from a given RF power die and toward the thermal interface of the RF package. Concurrently, the volume of higher cost materials contained in embodiments of the HTP substrate may be minimized (relative to a dimensionally-comparable multilayer flange) to reduce the overall material costs associated with incorporation of the HTP substrate into a given RF package.

By virtue of the above-mentioned structural characteristics, embodiments of the HTP substrate provide high levels of design flexibility and are amenable to integration into a wide range of RF package types. As a first example, embodiments of the HTP substrate are well-suited for integration into RF packages fabricated utilizing electrically-routed substrates, such as PCBs, in which case the metallic base structure may assume the form of, or may encompass, at least one metallic base coin embedded within the dielectric substrate body and to which one or more CTE matched mount pads are bonded. As a second example, embodiments of the HTP substrate may be integrated into RF packages fabricated utilizing leadframe-based manufacturing approaches, such as dual flat no-lead (DFN), quad flat no-lead (QFN), and other flat no-lead packages, as well as LGA packages and similar package types, in which case the metallic base structure may assume the form of a central metal block of the leadframe (again, herein a "die attach pad" of the leadframe). As a still further example, embodiments of the HTP substrate can be integrated into RF packages, including both overmolded RF packages and air cavity RF packages, of the type commonly fabricated utilizing metallic base flanges, in which case the metallic base structure may assume the form of a modified metallic base flange having a monolithic or layered construction. In this latter instance, one or more CTE matched mount pads may be bonded to the upper (die-facing surface) of the metallic base flange; and, in certain embodiments, may be at least partially embedded or recessed within the base flange body to yield the HTP substrate ultimately incorporated into the RF package.

Regardless of the particular RF package type into which the HTP substrate is incorporated, embodiments of the HTP substrate are amenable to cost effective manufacturing processes. For example, embodiments of the CTE matched mount pads may be provided in the format of an initially-interconnected array having a desired (e.g., grid or strip) spatial layout, with the mount pads interconnected or physically tied together by narrowed intervening structures, such as spars or tie bars. The CTE matched mount pad array may then be processed (e.g., by bonding to a corresponding array of metallic base structures) to fabricate a relatively large number of HTP substrates in parallel, possibly while further undergoing additional processing to commence RF package manufacture prior to separation or singulation of the CTE matched mount pad array. An example of such a large scale, array-based manufacturing approach is described below in connection with FIGS. 7-10. Additionally or alternatively, embodiments of the HTP substrate may have certain characteristics facilitating the formation of high structural integrity, low thermal resistance sinter or diffusion bonds at interfaces between the metallic base structure and the CTE matched mount pads, as further discussed below in connection with FIGS. 11 and 12. Prior to this, an example RF package (specifically, a Doherty PA package) containing a HTP substrate, which includes multiple CTE matched mount pads to which different RF power dies are attached, is discussed in connection with FIGS. 1-6. While described below in connection with a particular RF package type having a particular circuit layout or structure (namely, an air cavity package containing a Doherty PA circuit structure), embodiments of the HTP substrate can be incorporated into a wide range of RF package types containing at least one RF power die mounted to an underlying substrate utilized for heat dissipation, and possibly electrical interconnection, purposes.

General Discussion of Example RF Packages Containing HTP Substrates

Figure 2:
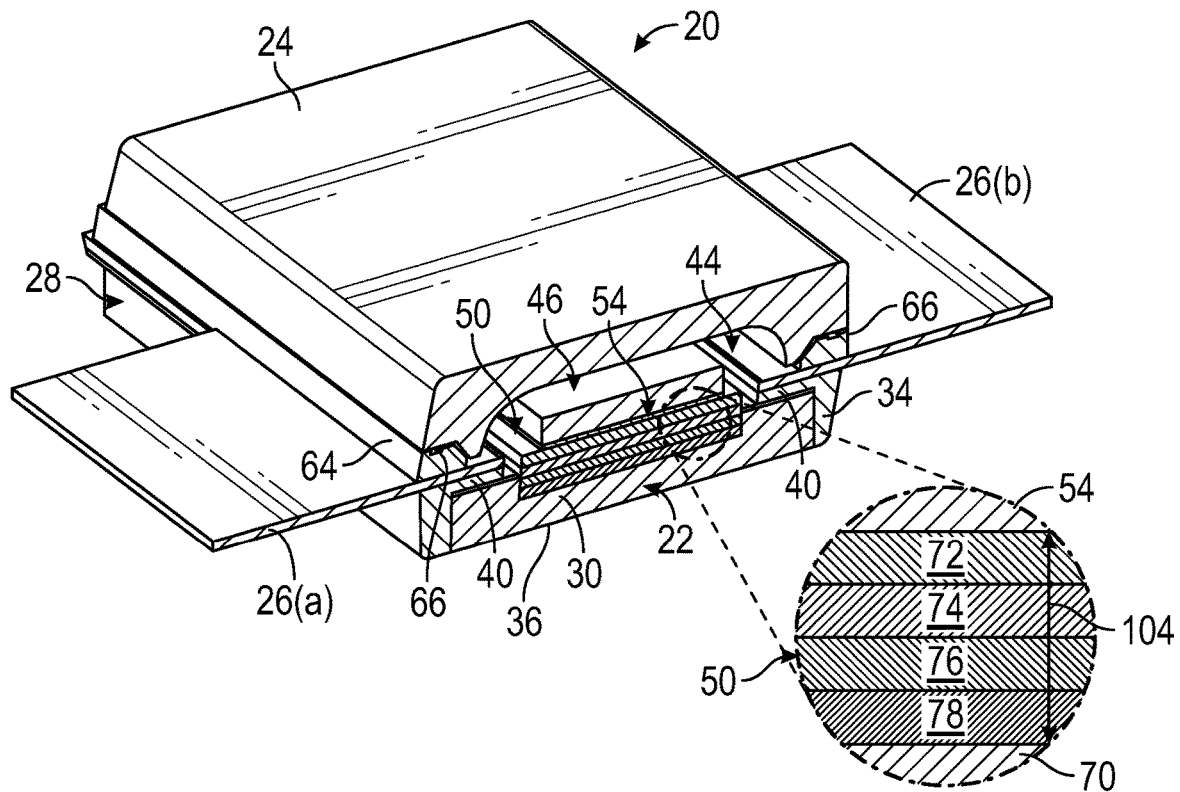

FIGS. 1 and 2 are cross-sectional and cross-sectional isometric views, respectively, of an example RF package containing an HTP substrate 22, as illustrated in accordance with an example embodiment. In the illustrated example, RF package 20 assumes of the form of a molded air cavity package. However, RF package 20 may assume other forms in alternative implementations, such as an overmolded package lacking a gas-containing cavity (also referred to as a "plastic package" or an "encapsulated package"); an air cavity package constructed utilizing a window frame approach; or an RF package containing a different lead type, such as a no-lead package or a gullwing package. Progressing from top to bottom in FIGS. 1 and 2, RF package 20 includes a lid or cover piece 24, multiple outwardly-projecting package leads 26, and a lower molded package body 28. Molded package body 28 is formed around HTP substrate 22 and, specifically, around a flange-like metallic base structure 30 included in HTP substrate 22. RF package 20 contains or encloses a central air cavity 32, which is principally bound by cover piece 24, molded package body 28, and metallic base structure 30 of HTP substrate 22. While referred to as an "air cavity" by industry standards, air cavity 32 may contain air, another inert gas, or a gas mixture, and may or may not be partially evacuated or pressurized relative to the ambient environment. The hermicity of air cavity 32 will vary amongst embodiments, although RF package 20 is usefully produced such that relatively little, if any leakage occurs between air cavity 32 and the ambient environment.

Molded package body 28 can be formed to have various different geometries and structural features. In the illustrated example, specifically, molded package body 28 is produced to include a bottom edge portion or lower peripheral skirt 34; the terms "lower," "bottom," and similar terms of orientation defined based upon proximity to a bottom principal surface or backside 36 of metallic base structure 30, which may be plated or left bare. Lower peripheral skirt 34 is bonded to and extends around an outer periphery of metallic base structure 30 of HTP substrate 22, as taken about centerline 38 of RF package 20. The bottom principal surface or backside 36 of metallic base structure 30 is exposed through a lower central opening, which is provided in molded package body 28 and which is peripherally bounded by lower peripheral skirt 34. By exposing backside 36 of metallic base structure 30 from the exterior or underside of RF package 20 in this manner, electrical connection to metallic base structure 30 may be facilitated as may be useful when, for example, HTP substrate 22 serves as a (e.g., ground) terminal of package 20. As another benefit, the exposed region of base structure backside 36 serves as a thermal interface of RF package 20 to promote heat removal from RF package 20 by conductive heat transfer through HTP substrate 22, as described in detail below. The foregoing benefits are generally optimized when at least a majority, if not the substantial entirety of base structure backside 36 (considered by surface area) is exposed through peripheral skirt 34 of molded package body 28, as shown.

Molded package body 28 further contains one or more inwardly-extending ledge portions or "lead isolation shelves 40," which encroach inwardly toward package centerline 38 and extend along outer peripheral portions of the upper or die-facing surface 42 of metallic base structure 30. Lead isolation shelve 40 underlie inner terminal end portions of package leads 26, which extend into the package interior of RF package 20 and are exposed within air cavity 32 for interconnections (e.g., wire bonding) with the microelectronic components (e.g., the below-described RF power dies 46, 48) contained within RF package 20. Lead isolation shelves 40 serve, in effect, as intervening dielectric layers, which reside between the respective lower surfaces of package leads 26 and frontside or upper surface 42 of metallic base structure 30 (FIG. 1), as taken vertically through RF package 20 along the package or device centerline 38. Lead isolation shelve 40 thus provide lead-flange electrical insulation, while further helping to mechanically join package leads 26 and HTP substrate 22. Finally, lead isolation shelve 40 may surround the peripheral surfaces of inner lead end portions 44, while leaving exposed the upper surfaces of inner lead end portions 44 from within the package interior for subsequent electrical interconnection.

RF package 20 can contain any number and type of microelectronic components including one or more RF power dies; and, perhaps, additional IC dies bearing other circuitry, such as bias circuitry, harmonic terminations, impedance matching networks, and the like. In the illustrated example, RF package 20 contains a first RF power die 46 (shown in FIGS. 1-5) and a second RF power 48 (shown in FIGS. 3-5). RF power dies 46, 48 are mounted to CTE matched mount pads 50, 52 included in HTP substrate 22 utilizing one or more bodies or layers 54, 56 of an electrically-conductive bonding material, such as a sintered material, a solder material, or an electrically-conductive die attach material. Addressing first RF power die 46, and as shown exclusively in FIG. 1, a number of bond pads 58 present on the frontside of RF power die 46 can be electrically interconnected with exposed inner portions 44 of package leads 26 utilizing, for example, a number of wire bond arrays 62. In alternative implementations, another interconnection approach may be employed to electrically interconnect bond pads 58 of RF power die 46 with corresponding package terminals. A first lead 26(*a*) projects from a first side of RF package 20 and serves as an input lead electrically coupled to the input (e.g., gate) terminal of RF power die 46; while a second lead 26(*b*) projects from a second, opposing side of package 20 and serves as an output lead electrically coupled to the output (e.g., drain) terminal of RF power die 46. In certain instances, HTP substrate 22 may itself serve as a ground terminal of RF package 20 and, therefore, may be electrically coupled to a source terminal of RF power die 46; specifically, HTP substrate 22 may be electrically coupled to the source region(s) of one or more peaking or carrier transistors formed in RF power die 46. In embodiments, RF power die 46 is electrically coupled to HTP substrate 22 through a backmetal layer (FIG. 1), which may be a plated metal layer or multilayer system formed on the backside of RF power die 46.

Figure 3:
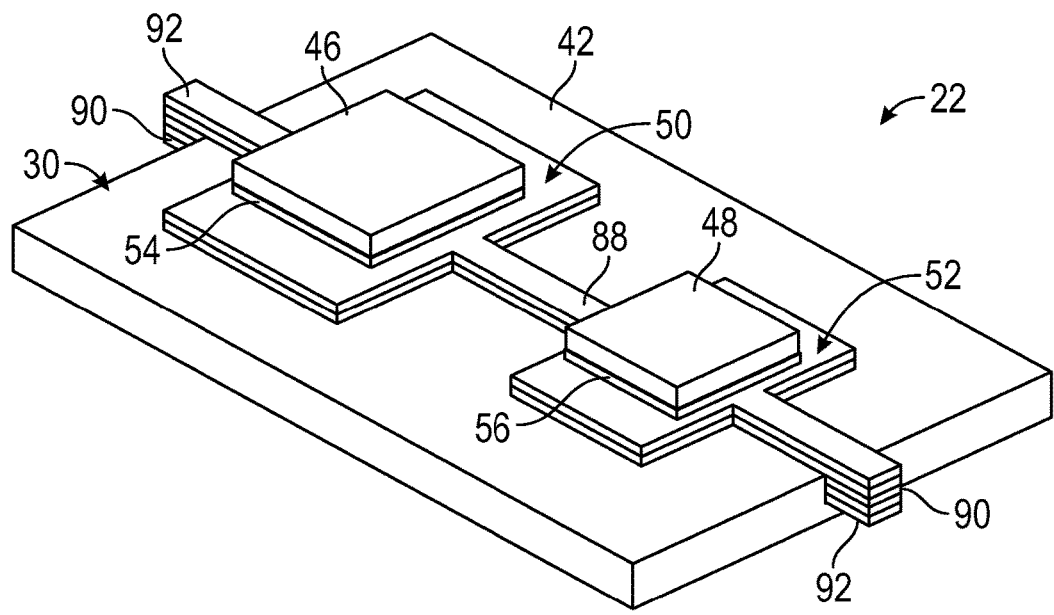
FIGS. 3, 4, and 5 are isometric, planform (top-down), and exploded views, respectively, of the RF power dies and the HTP substrate included in the example air cavity PA package shown in FIGS. 1 and 2.
Figure 4:
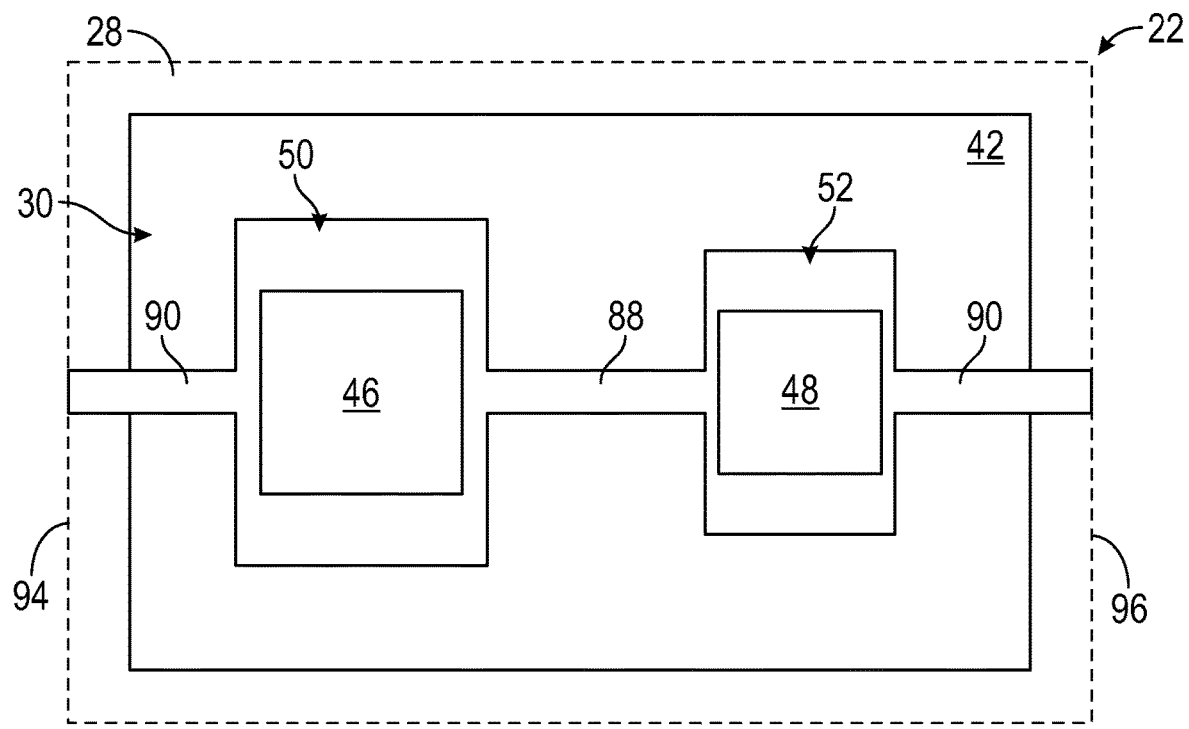
Figure 5:
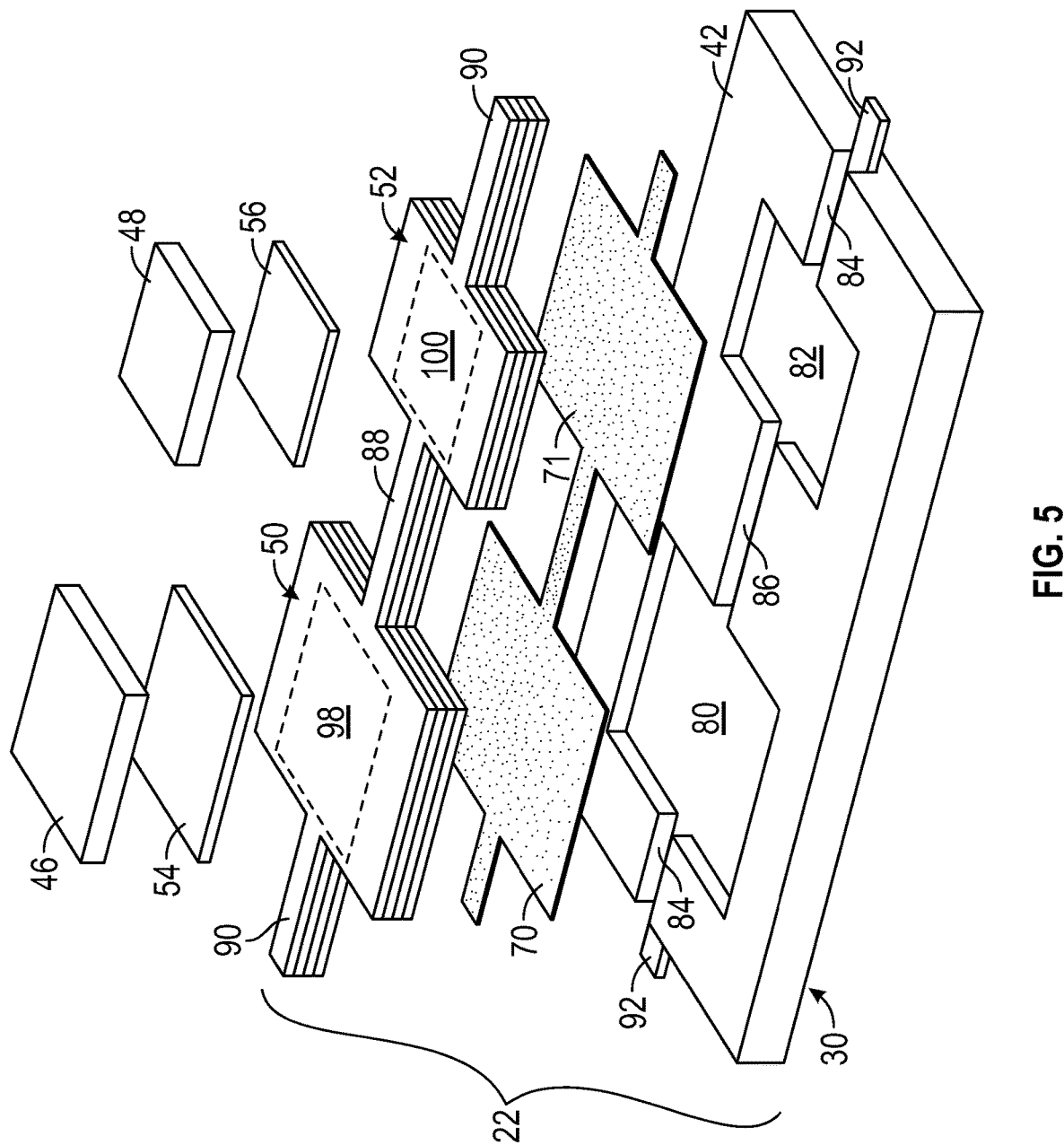

Referring now to FIGS. 3-5 in conjunction with FIGS. 1 and 2, RF package 20 is fabricated for incorporation into a Doherty PA circuit structure in certain embodiments, with an example of such a Doherty PA circuit described below in connection with FIG. 6. In such embodiments, RF power die 46 may function as a carrier PA die bearing a carrier transistor power amplifier IC is integrated, which is electrically coupled between package leads 26(*a*), (*b*). Comparatively, RF power die 48 may serve as a peaking PA die bearing a peaking transistor IC electrically coupled between an additional set of non-illustrated package leads, which are similar or substantially identical to leads 26(*a*), 26(*b*) shown in FIGS. 1 and 2. Accordingly, and in a manner analogous to that described above, RF power die 48 may have an input (e.g., gate) terminal coupled to a second input lead of RF package 20, an output (e.g., drain) terminal coupled to a second output lead of RF package 20, and a source terminal coupled to HTP substrate 22 (which, in this instance, serves as a ground terminal of RF package 20). Various additional components (e.g., additional dies and/or Surface Mount Devices (SMDs)) may be incorporated into RF package 20 to provide other functionalities, such as impedance matching on the input and/or output sides of packaged RF power dies 46, 48. After installation of RF power dies 46, 48 (and any other circuit elements) within the interior of RF package 20, and interconnection of RF power dies 46, 48 with the corresponding package leads, cover piece 24 is positioned over molded package body 28 and bonded to an upper peripheral edge portion 64 of package body 28 to sealingly enclose air cavity 32. In particular, the lower peripheral edge of the cover piece 24 may be bonded to an upper peripheral edge portion 64 of molded package body 28 by a ring of bonding material 66 to yield a substantially gas-tight seal around the periphery of the cover-body interface. Again, in further implementations, RF package 20 may assume other forms, such as that of a fully-encapsulated package lacking an air cavity and cover piece.

HTP substrate 22 can be fabricated to include any practical number of CTE matched mount pads, which, in the example of FIG. 1, project upwardly from upper surface 42 of metallic base structure 30 to form raised, pedestal-like support features. In embodiments, HTP substrate 22 may be fabricated to include a single CTE matched mount pad to which one or more RF power dies (e.g., RF power dies 46, 48), and perhaps other heat-generating microelectronic components, are attached utilizing a suitable thermally-conductive bonding material. In other instances, HTP substrate 22 may include three or more mount pads, each supporting a different semiconductor die; e.g., RF power dies included in a single stage or multiple stage amplifier sections, dies bearing impedance matching networks, dies bearing bias circuitry, or dies bearing another type of integrated circuitry usefully incorporated into RF package 20. In the illustrated example, and as most clearly shown in FIGS. 3-5, HTP substrate 22 includes two CTE matched mount pads 50, 52, which are bonded to the die-facing upper surface 42 of metallic base structure 30. In certain instances, CTE matched mount pads 50, 52 may be bonded to metallic base structure 30 utilizing one or more layers of a thermally-conductive bonding material 70, 71, as shown FIG. 5. In this case, thermally-conductive bonding material 70, 71 may be composed of a solder material, a sintered material, a braze material, or another bonding material having a relatively high thermal conductivity. In other embodiments, CTE matched mount pads 50, 52 are diffusion bonded to metallic base structure 30, in which case electrically-conductive bonding material layers 70, 71 may be omitted from HTP substrate 22. CTE matched mount pads 50, 52 are each formed and positioned to cover a die attach region of metallic base structure 30; that is, the regions of base structure 30 directly underlying RF power dies 46, 48, as taken along an axis extending orthogonal to frontside or upper surface 42 of base structure 30 (parallel to centerline 38). In the illustrated example, specifically, CTE matched mount pads 50, 52 are spaced along an axis extending perpendicular to the centerline of HTP substrate 22; e.g., the length direction of RF package 20 corresponding to the X-axis of coordinate legend 68 (FIGS. 1 and 4). In further embodiments, however, the particular dimensions, shape, and spatial orientation of CTE matched mount pads 50, 52 may be varied to best suit a particular RF package design or circuit layout.

With continued reference to FIGS. 1-5, CTE matched mount pads 50, 52 are each composed of one or more thermally-conductive materials; the term "thermally conductive," as appearing herein, defined as a material having a thermal conductivity (in Watts per meter Kelvin) greater than 10 at 25 degrees Celsius. CTE matched mount pads 50, 52 are also produced to possess CTEs greater than the respective CTEs of the supported RF power dies and less than the CTE of metallic base structure 30. Accordingly, in the illustrated example, CTE matched mount pad 50 is produced or selected to have a CTE exceeding the CTE of RF power die 46 and less than the CTE of metallic base structure 30. Similarly, CTE matched mount pad 52 is imparted with a CTE exceeding the CTE of RF power die 48, while being less than the CTE of metallic base structure 30. In many instances, the mount pad CTEs will be closer to the CTE of base structure 30 than to the respective CTEs of RF power dies 46, 48. This stated, the CTEs of RF power dies 46, 48 will vary between embodiments depending upon, for example, the die technology utilized to produce dies 46, 48; e.g., whether RF power dies 46, 48 are fabricated utilizing bulk silicon, a layered GaN substrate (e.g., a gallium nitride/silicon carbide (GaN/SiC) substrate), or another semiconductor-containing material. Further, RF power dies 46, 48 may have different CTEs if, for example, different die technologies are utilized to produce dies 46, 48. Generally, RF power dies 46, 48 will often each have a CTE less than 6.5 and, in many instances, may each have a CTE ranging from about 3 to about 5. Comparatively, in embodiments, the CTE of metallic base structure 30 may exceed the die CTE by a factor of two or more, depending upon the material or materials from which base structure 30 is fabricated. For example, in embodiments in which metallic base structure 30 is composed predominately of Cu by weight, metallic base structure 30 may have CTE ranging from about 16 and to about 17, while the die CTE may be less than 6.5 and, perhaps, less than 5. In other instances, metallic base structure 30 may be fabricated from multiple layers of material (including one or more Mo-containing layers) and have a cumulative CTE less than the aforementioned range, as further discussed below.

Discussing further the mount pad CTEs, in many instances, CTE matched mount pads 50, 52 will have similar or identical compositions and, therefore, share substantially equivalent CTEs. In other implementations, CTE matched mount pads 50, 52 may have disparate constructions or varying compositions as selected to impart mount pads 50, 52 with different CTEs tailored to the characteristics of the microelectronic component or components supporting by the mount pad (e.g., the CTE of a supported RF power die or the propensity of the RF power die to generate large amounts of excess heat). CTE matched mount pads 50, 52 may each be a monolithic structure composed of a single (e.g., homogeneous or composite) material possessing a target CTE and other desirable properties, such as a relatively high thermal and electrical conductivities. In this case, CTE matched mount pads 50, 52 may be monolithic or unitary block-like structures each composed of a composite material or a metallic material (e.g., Mo or Mo—Cu alloy) having a CTE falling within the desired range, possessing a relatively high thermal conductivity, and often further possessing a relatively high electrical conductivity. Alternatively, and as shown in FIGS. 1-5, CTE matched mount pads 50 may be produced as layered or laminate structures, which can include any practical number of mount pad layers 72, 74, 76, 78 (identified in FIG. 2). For example, in this latter case, layers 72, 74, 76, 78 may each be composed of a metallic material; and, when so composed, may be referred to herein as a "metal layer." A given metal layer may be wholly composed of an essentially pure metal (that is, a metal having a purity exceeding 99.9% by weight), such as essentially Cu, Mo, silver (Ag), gold (Au), aluminum (Al), or nickel (Ni), to list but a few examples. In other instances, a particular "metal layer" may be composed of an alloy or composite material containing one or more metals (e.g., Cu and/or Mo) as its primary constituents, possibly in addition to lesser amounts of other metallic or non-metallic constituents. CTE matched mount pads 50, 52 may also each have a thermal conductivity less than that of metallic base structure 30 in embodiments, with an acceptable tradeoff realized in producing mount pads 50, 52 to have a reduced CTE, while also possessing a slight to moderate reduced thermal (and possibly electrical) conductivity as compared to base structure 30 or a conventional metallic base flange.

In various implementations, the CTE matched mount pad or pads (e.g., mount pads 50, 52) contained in HTP substrate 22 may contain three to five mount pad layers, although a given CTE mount pad may have as few as two layers or more than five layers, as well. In the illustrated example, specifically, CTE matched mount pads 50, 52 each contain four mount pad layers 72, 74, 76, 78, which are bonded in a stacked or laminate relationship. In this case, upper mount pad layer 72 may be composed of a material having a thermal conductivity and a CTE greater than at least one of the underlying mount pad layers 74, 76, 78. For example, in certain embodiments, upper mount pad layer 72 may be composed of essentially pure Cu or, alternatively, a Cu-based alloy or composite having a higher Cu content than the Cu content of at least one of mount pad layers 74, 76, 78. In one embodiment, upper mount pad layer 72 and intermediate mount pad layer 76 are each composed of a Cu-based alloy or composite having a first Cu content, while intermediate mount pad layer 74 and lower mount pad layer 78 are composed of a disparate alloy or composite lacking Cu or otherwise containing a lesser amount of Cu by weight. Further, mount pad layers 74, 78 may be composed of essentially pure Mo (having a CTE of about 5 or greater) or a Mo-based material, such as a Cu—Mo composite or alloy having a Cu content less than that of mount pad layers 72, 76. Accordingly, the thermal conductivity of mount pad layer 74, 78 may be slightly less than that of mount pad layers 72, 76 (although still objectively high), while the respective CTEs of metal layers 74, 78 are less than that of mount pad layers 72, 76 to reduce the effective cumulative CTE of mount pads 50, 52.

When composed of metallic materials, the principal surfaces of mount pad layers 72, 74, 76, 78 may be plated, coated, or left bare. In alternative embodiments, CTE matched mount pads 50, 52 may have a multilayer composition, or may otherwise be composed of different material regions, in which one or more layers (or regions) are composed of a material having a thermal conductivity exceeding than that of essentially pure copper (e.g., 386 Watts per meter Kelvin (W/m·K)), such as diamond polycarbonate materials, composite materials (e.g., diamond-metal composites, such as diamond Au, diamond Ag, and diamond Cu), pyrolytic graphite, and materials containing allotropes of carbon, such as graphene and carbon nanotube-filled materials. Alternatively, and as noted above, CTE matched mount pads 50, 52 may have monolithic or non-layered compositions in further implementations and may each be composed of a metallic material or any of the other materials mentioned throughout this document having relatively high thermally conductivities and, when RF power dies are 46, 48 are electrically coupled to metallic base structure 30, relatively high electrical conductivities. Further, when produced as a composite block, selected surfaces of CTE matched mount pads 50, 52 may be coated or plated (e.g., with an Ag-containing plating layer or multilayer system) to provide high integrity, metallurgical bonds along the below-described mount pad-base structure interfaces or bond lines.

The particular manner in which mount pad layers 72, 74, 76, 78 are bonded in a stacked or vertically-overlapping relationship can vary between embodiments. In certain cases, mount pad layers 72, 74, 76, 78 may be bonded utilizing a thermally-conductive bonding material, such as a solder, braze, or a sintered material of the type described below in conjunction with bonding layer 70. In other instances, mount pad layers 72, 74, 76, 78 are joined by diffusion bonding. In such instances, mount pad layers 72, 74, 76, 78 may be initially provided as relatively large sheets of material, which are bonded as a laminate structure and subsequently subjected to a material removal or forming process (e.g., laser cutting, sawing, stamping, or the like) to separate the laminated sheets into a plurality of mount pads having the desired dimensions and topology. When imparted with different compositions, CTE matched mount pads 50, 52 may cleaved or otherwise fabricated from different sheets or panels in this manner. Conversely, when fabricated to have identical compositions or constructions, CTE matched mount pads 50, 52 may be cut or cleaved from a common sheet of laminate metallic layers, while the panel is trimmed to leave smaller connective segments of material (e.g., the below-described tie bars) physically interconnecting CTE matched mount pads 50, 52 as a relatively large array of bond pads arranged in a desired spatial layout or array, such as a grid or strip layout.

The above-described manufacturing approach may streamline manufacturing by allowing a large number of CTE matched mount pads to be positioned and bonded to corresponding number of base structures (also potentially provided as an interconnected array) in a large scale manufacturing process, an example of which is discussed below in connection with FIGS. 7-10. In this case, such connective segments or tie bars may be integrated into HTP substrate 22 and extend outwardly from mount pads 50, 52 in lateral directions; that is, in the X-Y plane of coordinate legend 68. For example, as shown in FIGS. 3-5, an intermediate tie bar 88 may extend between CTE matched mount pads 50, 52 to physically interconnect adjacent mount pads 50, 52; while peripheral tie bars 90 further extend from mount pads 50, 52 in laterally-outward directions to initially interconnect CTE matched mount pads 50, 52 with a larger mount pad array, as discussed below in connection with FIGS. 7 and 9. Additionally, peripheral tie bars 92 (FIGS. 3 and 5) may likewise extend from metallic base structure 30 to initially interconnect base structure 30 with a larger array of metallic base structures processed during HTP substrate and RF package fabrication. When provided, tie bars 90, 92 may be integrally formed with CTE matched mount pads 50, 52 by, for example, cutting, stamping, or otherwise forming tie bars 90, 92 and mount pads 50, 52 from a larger sheet or block of material, as further discussed below in connection with FIGS. 7-10.

In at least some implementations, CTE matched mount pads 50, 52 may be at least partially embedded within or recessed into metallic base structure 30. For example, and as shown most clearly in FIG. 5, metallic base structure 30 may be fabricated to include open recesses or socket-like cavities 80, 82 into which mount pads 50, 52 are received. Depending upon cavity depth and geometric complexity, open cavities 80, 82 may be formed, in part or in while, utilizing a shaping or forming technique, such as stamping. Additionally or alternatively, open cavities 80, 82 may be formed utilizing a material removal process, such as a computerized numerical control (CNC) machining or an electro discharge machining (EDM) tool cutting open cavities 80, 82 into upper surface 42 of metallic base structure 30. Open cavities 80, 82 may be imparted with planform shapes substantially matching the planform shapes of CTE matched mount pads 50, 52 and with planform dimension (e.g., lengths and widths) substantially equivalent to, but slightly larger than those of mount pads 50, 52; although a peripheral clearance may be provided between the sidewalls of open cavities 80, 82 and the sidewalls of CTE matched mount pads 50, 52 to accommodate additional bonding material or bonding material overflow in certain embodiments.

As shown in FIG. 1-5, the respective depths of open cavities 80, 82 may be less than the thicknesses of mount pads 50, 52, as measured in a package thickness direction (along the Z-axis of coordinate legend 68). As a result, mount pads 50, 52 may project upwardly from upper surface or frontside 42 of metallic base structure 30 to form raised pedestal-like features to which RF power dies 46, 48 are mounted or attached. In other instances, the respective depths of open cavities 80, 82 may substantially equivalent to (or perhaps greater than) the thicknesses of mount pads 50, 52 such that the upper mount pad surfaces are substantially coplanar with (or recessed slightly below) upper surface 42 of base structure 30. Further, in embodiments in which mount pads 50, 52 are recessed into base structure 30 and interconnected by tie bars 88, 90, a number of elongated recesses, trenches, or open channels 84, 86 may further be formed in base structure 30. As best shown in FIG. 5, channel 86 may extend between open cavities 80, 82 and receive or locate intermediate tie bar 88 when the mount pad structure (CTE matched mount pads 50, 52 and tie bars 88, 90) are positioned against metallic base structure 30. Comparatively, peripheral tie bars 90 may be partially or wholly received within peripheral channels 84 formed in frontside 42 of base structure 30, with tie bars 90 extending above and substantially parallel to base structure tie bars 92. Tie bars 90, 92 may further extend to opposing sidewalls 94, 96 of molded package body 28, which are defined following package overmolding and singulation, as discussed below in conjunction with FIGS. 7-10.

CTE matched mount pads 50, 52 can be bonded or otherwise joined to metallic base structure 30 in any manner allowing low thermal resistance conduction of heat across the mount pad-base structure interface. In this regard, CTE matched mount pads 50, 52 may be joined to metallic base structure 30 by diffusion in embodiments. In such cases, a convergent pressure may be applied to CTE matched mount pads 50, 52 and metallic base structure 30 under elevated temperatures, such as temperatures approaching or exceeding 800° C., for a time period adequate to form the desired diffusion bonds at the mount pad-base structure interface. In other instances, and as indicated in FIG. 5, a thermally-conductive bonding material 70, 71 may be applied at the interfaces between CTE matched mount pads 50, 52 and metallic base structure 30 to create bond joints the interface mount pad-base structure interfaces. Examples of suitable bonding materials 70, 71 include solders, thermally-conductive die attach materials, braze materials, and sintered materials. With respect to sintered materials, in particular, such sintered bond layers may be predominately composed of one or more sintered metals, by weight, with such sintered metals potentially including any combination of Ag Cu, and Au. In many instances, a sintered bond layer may contain non-trace amounts of Ag, if not contain Ag as a predominate constituent by weight. For example, in at least some implementations, a sintered bond layer may be formulated to consist essentially of sintered Ag (that is, contain at least 99% sintered Ag, by weight), while lacking organic materials. In other embodiments, a sintered bond layer may consist essentially of sintered Ag and one or more organic materials, such as epoxy added to enhance the pliability of the die bond layer, as further described below in connection with FIGS. 7 and 8. In still further embodiments, a combination of the above-described bonding types and/or, perhaps, mechanical capture of mount pads 50, 52 against base structure 30 (e.g., utilizing a shrink fit technique) may be utilized in fabricating HTP substrate 22.

The planform geometry, dimensions, and spatial disposition of CTE matched mount pads 50, 52 will vary between embodiments of HTP substrate 22 and, more broadly, RF package 20. This stated, CTE matched mount pads 50, 52 will generally be shaped and dimensioned such that the upper surfaces of mount pads 50, 52 (facing away from metallic base structure 30) have a cumulative surface area less than the surface are of upper surface 42 of metallic base structure 30 and greater than the surface area of die mount areas 98, 100 (identified in FIGS. 1-5) covered by RF power dies 46, 48 when attached to mount pads 50, 52, respectively. Stated differently, CTE matched mount pads 50, 52 are each dimensioned to have planform dimensions (e.g., a length and width) greater than the length and width of the respective footprints of RF power dies 46, 48. In embodiments, the maximum thickness of metallic base structure 30 (identified by arrow 102 in FIG. 1) may exceed the maximum thickness of each CTE matched mount pad 50, 52 (identified in by arrow 104 in FIG. 2), as measured in a package thickness direction corresponding to the Y-axis of coordinate legend 68; while this may not be the case in other instances. In embodiments, metallic base structure 30 may further have a maximum thickness ranging from about 10 to about 65 mils and, perhaps, from about 15 to about 30 mils, as measured in a package thickness direction (corresponding to the Z-axis of coordinate legend 68). Comparatively, CTE matched mount pads 50, 52 may each have a maximum or average thickness ranging from ranging from about 2 to about 60 mils; or, perhaps, from about 20 to about 25 mils in embodiments. For example, in one implementation in which CTE matched mount pads 50, 52 are produced to each include at least two Cu layers interspersed with (that is, disposed in an alternating stacked or laminated relationship with) at least one Mo layer, the mount pad thickness may range from about 2 mil to about 60 mil. In other implementations, the respective thicknesses of metallic base structure 30 and of CTE matched mount pads 50, 52 may be greater than or less than the aforementioned ranges. When having a multilayer construction, as shown in FIGS. 1-5, the respective thicknesses of the layers 72, 74, 76, 78 (FIG. 2) included in CTE matched mount pads 50, 52 will often be substantially equivalent or uniform; although the layer-to-layer thickness of CTE matched mount pads 50, 52 can vary in further implementations to, for example, optimize the properties of mount pads 50, 52 or to reduce material expenses of mount pads 50, 52.

By forming CTE matched mount pads 50, 52 to have reduced planform dimensions (lengths and widths) compared to the planform dimensions of metallic base flange 30, the volume of higher cost materials within HTP substrate 22 can be minimized, while bringing about the desired reductions in CTE mismatch at the die-substrates interfaces between HTP substrate 22 and RF power dies 46, 48. Concurrently, metallic base flange 30 may retain a relatively high stiffness due to the greater thickness of metallic base flange 30 in the peripheral regions of base flange 30 not covered by mount pads 50, 52, as measured in a package height direction (again, corresponding to the Z-axis of coordinate legend 68). As a result, metallic base flange 30 may be resistant to undesired dimensional changes, such as variations in flatness due to warping during high temperature processing, compared to a multilayer flange of substantially equivalent dimensions. As a still further benefit, HTP substrate 22 affords manufacturers with a relatively high level of design flexibility by, for example, enabling variations in the respective positioning, construction, and sizing of CTE matched mount pads 50, 52 to best suit a particular package layout or to provide thermal dissipation capabilities tailored the unique cooling needs of different RF power dies and possibly other packaged microelectronic components. Consequently, in embodiments, HTP substrate 22 may be readily designed or structurally adapted to provide increased heat dissipation from, or increased CTE matching with, one or more targeted RF power dies within RF package 20, as further discussed below.

Through dimensional tailoring of CTE matched mount pads 50, 52, mount pads 50, 52 can be shaped and dimensioned to support RF power dies and other microelectronic components of varying sizes and/or to each support any practical number of microelectronic components. Similarly, through such dimensional tailoring to fine tune the respective mount pad volumes, the rate at which CTE matched mount pads 50, 52 transfer excess heat from the supported devices (e.g., RF power dies 46, 48) can be varied and, therefore, optimized to provide greater or lesser degrees of heat removal or heat spreading to specific microelectronic devices (e.g., specific RF power die types) to optimize the functioning thereof. Consider, as a non-limiting example, an embodiment in which RF power dies 46, 48 assume the form of carrier and peaking PA dies incorporated into a Doherty PA circuit structure. In this case, RF power die 46 (here, assuming the form of a carrier PA die bearing a carrier transistor IC) may have a propensity to generate greater amounts of excess heat during package operation relative to RF power die 48 (here, assuming the form of a peaking PA die bearing a peaking transistor IC), which may remain in a non-conducting OFF state for greater periods of time. Accordingly, CTE matched mount pad 50 (supporting RF power die 46) may be dimensioned to have a volume exceeding that of CTE matched mount pad 52 by, for example, imparting mount pad 50 with planform dimensions (e.g., a width and/or a length) greater than the planform dimensions of mount pad 52. For example, and as best seen in FIG. 4, CTE matched mount pad 50 may be imparted with both a length (measured along the X-axis of coordinate legend 68) and a width (measured along the Y-axis of coordinate legend 68) exceeding the length and width of mount pad 52. Additional description of a Doherty circuit structure into which RF package 20 may be incorporated will now be provided in connection FIG. 6.

Figure 6:
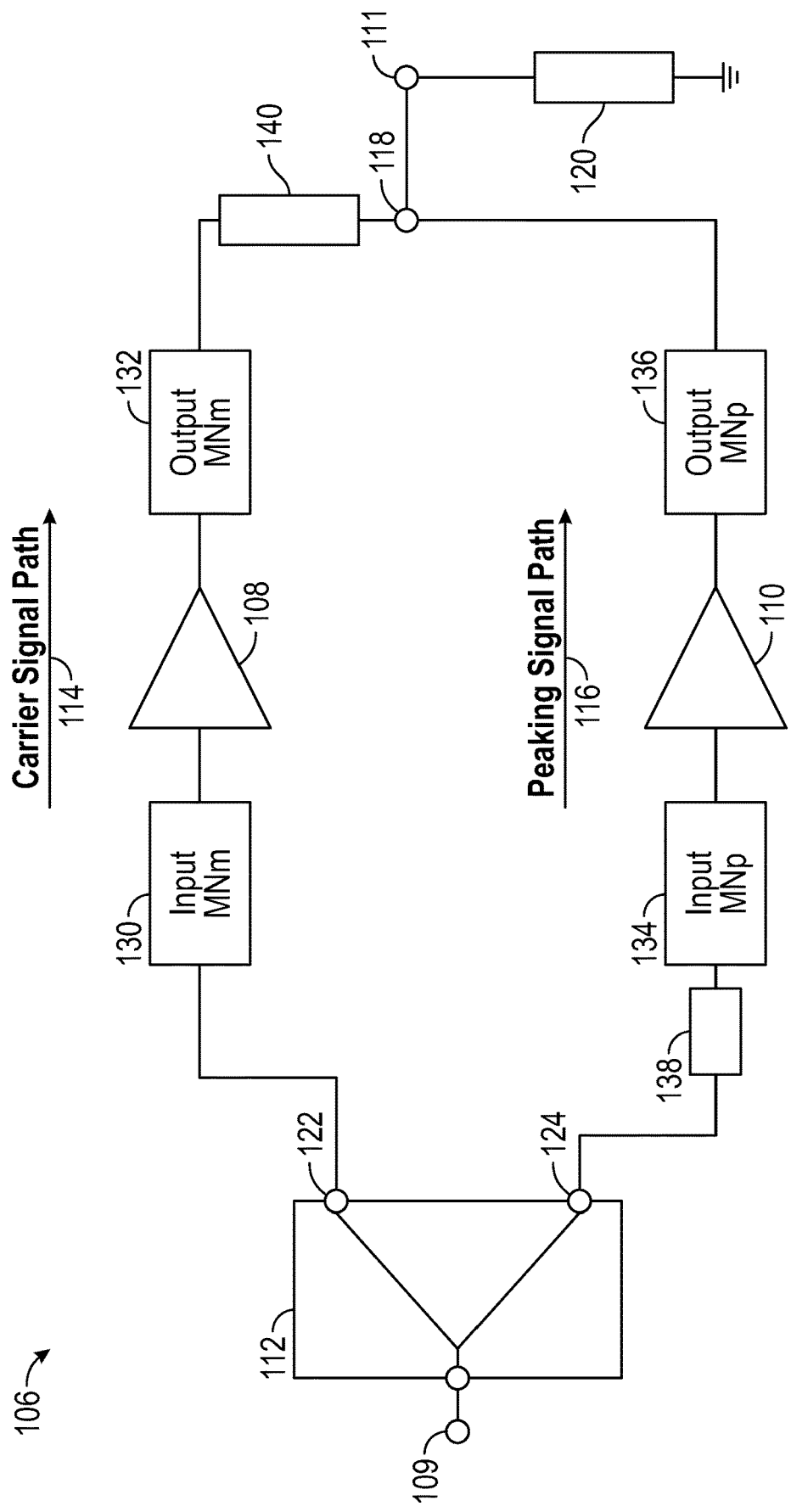
FIG. 6 is a simplified schematic diagram of an example Doherty PA circuit structure, a portion of which may be implemented utilizing the RF power dies contained in the example air cavity PA package shown in FIGS. 1-5, in embodiments of present disclosure.

FIG. 6 is a simplified schematic diagram of a Doherty PA circuit 106, which may be partially implemented utilizing the RF power dies contained in example RF package 20 shown in FIGS. 1-5, in embodiments of present disclosure. In particular, transistor amplifier sections 108, 110 of Doherty PA circuit 106 may be provided utilizing RF power dies 46, 48 contained within RF package 20, with the remaining circuit structure produced utilizing a motherboard or other system-level PCB to which RF package 20 and other packages or devices are mounted. In further embodiments, RF package 20 can be produced to encompass or contain a greater fraction Doherty PA circuit 106 including any combination of the below-described power divider, impedance matching networks, phase delay elements, combiner node, and other circuit elements of the type commonly employed in PA circuit designs. With respect to the below-described input-side and output-side impedance matching networks, in particular, such matching networks can be implemented on any number of IC dies, which may be incorporated into RF package 20 and each mounted to a CTE matched mount pad analogous to CTE matched mount pads 50, 52 described above in connection with FIGS. 1-5; multiple dies may be mounted to a single CTE matched mount pad 50, 52 with appropriate dimensional changes to the die-supporting mount pad or pads; or certain IC dies, such as IC dies bearing impedance matching networks or bias circuitry, may be mounted directly to metallic base structure 30, depending upon the heat dissipation needs of each individual die.

In the example of FIG. 6, Doherty PA circuit 106 includes an input node 109, an output node 111, and a power divider 112 (or splitter) electrically coupled between nodes 109, 111.

Doherty PA circuit 106 also includes a main or carrier amplifier signal path (represented by arrow 114), an auxiliary or peaking signal amplification path (represented by arrow 116), and a combining node 118 at which signal amplification paths 114, 116 converge. A load 120 is electrically coupled to combining node 118 (e.g., through a non-illustrated impedance transformer) to receive an amplified RF signal from Doherty PA circuit 106. Power divider 112 is configured to split the power of an input RF signal received at input node 109 into carrier and peaking portions; hereafter referred to as a "a carrier input signal" and a "peaking input signal." The carrier input signal is provided to carrier amplification path 114 via power divider output 122, while the peaking input signal is provided to peaking amplification path 116 via power divider output 124. When operating in a full-power mode in which carrier and peaking amplifier sections 108, 110 concurrently supply current to load 120, power divider 112 apportions the input signal power between signal amplification paths 114, 116. When circuit 106 is imparted with a symmetric Doherty PA configuration, power divider 112 may apportion power in a substantially equal manner, such that approximately one half of the input signal power is provided to each signal amplification path 114, 116. In other instances, such as when circuit 106 is imparted with an asymmetric Doherty PA configuration, power divider 112 may apportion power unequally between signal amplification paths 114, 116. Essentially, then, power divider 112 divides an input RF signal supplied at input node 109, with the divided signal portions then separately amplified along the carrier (main) and peaking (auxiliary) amplification paths 114, 116.

Carrier amplifier section 108 and peaking amplifier section 110 each include at least one power transistor IC for amplifying RF signals conducted through amplifier sections 108, 110. Each power transistor IC may be fabricated on a semiconductor die (e.g., RF power dies 46, 48 shown in FIGS. 1-5) and imparted with a single-stage or multi-stage configuration. In embodiments, all amplifier stages (or a final amplifier stage) of either or both carrier amplifier section 108 and peaking amplifier section 110 may be implemented utilizing any of the following: a silicon-based FET (e.g., a laterally-diffused metal oxide semiconductor FET or LDMOS FET) or a III-V FET (e.g., a GaN FET, a gallium arsenide (GaAs) FET, a gallium phosphide (GaP) FET, an indium phosphide (InP) FET, or an indium antimonide (InSb) FET, or another type of III-V transistor). The carrier and peaking transistor ICs may be equally sized when, for example, circuit 106 has a symmetric Doherty configuration. Alternatively, the carrier and peaking transistor ICs may have unequal sizes in the case of various asymmetric Doherty configurations; it being understood that the term "size," as appearing in this context, is utilized in reference to the active periphery or total active gate width of the power transistor ICs. In an asymmetric Doherty configuration, specifically, the carrier transistor IC(s) may be larger than the peaking transistor IC(s) by some multiplier. For example, the carrier transistor IC(s) may be twice the size of the peaking transistor IC(s) such that the carrier transistor IC(s) have approximately twice the current carrying capability of the peaking transistor IC(s). Carrier-to-peaking amplifier IC size ratios other than a 2:1 ratio may be implemented, as well. Notably, when the respective sizes of RF power dies 46, 48 vary relative to one another, the respective sizes (e.g., planform dimensions) of CTE matched mount pads 50, 52 may also be varied by design to better accommodate the disparity or difference in die size, if so desired.

While the foregoing paragraph principally focuses on example implementations of Doherty PA circuit 106 implemented utilizing FET-based amplifier sections, alternative embodiments can be implemented utilizing other transistor technology including, but not limited to, bipolar transistors. Accordingly, in embodiments of Doherty PA circuit 106, any and all amplifier stages can be implemented utilizing any suitable transistor technology, including FETs, bipolar transistors, and combinations thereof. Regardless of the particular transistor technology employed, carrier amplifier section 108 of Doherty PA circuit 106 is generally biased to function in class AB mode, while peaking amplifier section 110 is biased to function in class C mode. At low power levels (e.g., when the power of the input signal at node 109 is less than the turn-on threshold level of amplifier section 110), Doherty PA circuit 106 operates in a low-power or back-off mode. In the low-power mode, carrier amplifier section 108 is typically the only amplifier supplying current to load 120. When the power of the input signal exceeds a threshold level of peaking amplifier section 110, however, Doherty PA circuit 106 transitions to operation in a high-power mode in which carrier amplifier section 108 and the peaking amplifier section 110 supply current to load 120 concurrently. At this point, peaking amplifier section 110 provides active load modulation at combining node 118, allowing a continued, substantially linear increase in the current of carrier amplifier 108.

In embodiments of Doherty PA circuit 106, impedance matching networks 130, 132 (input MNm, output MNm) may be implemented at the input and at the output of carrier amplifier section 108. Similarly, impedance matching networks 134, 136 (input MNp, output MNp) may be implemented at the input and at the output of peaking amplifier section 110. In each case, matching networks 130, 132, 134, 136 may serve to incrementally increase the circuit impedance toward the load impedance and source impedance. In certain implementations, the impedance matching networks 130, 132, 134, 136 may be partially or wholly implemented inside RF package 20. In such embodiments, impedance matching networks 130, 132, 134, 136 may be implemented on a number of IC dies, which may be bonded to additional CTE matched mount pads included in alternative embodiments of HTP substrate 22; bonded to smaller number of relatively large CTE matched mount pads; or possibly bonded directly to upper surface 42 of metallic base structure 30 when possessing relatively modest heat dissipation needs relative to RF power dies 46, 48 and amplifier sections 108, 110. In other instances, impedance matching networks 130, 132, 134, 136 may be wholly or partially implemented outside of RF package 20, such as on a PCB to which RF package 20 is mounted.

In the example of FIG. 6, Doherty PA circuit 106 has a standard load network configuration. Accordingly, the input-side circuit portion is configured such that an input signal supplied to peaking amplifier section 110 is delayed by 90 degrees with respect to the input signal supplied to carrier amplifier section 108 at the center frequency of operation of, for example, Doherty PA circuit 106. To ensure arrival of the carrier and peaking input RF signals at amplifier sections 108, 110 with approximately 90 degrees of phase shift, a phase delay element 138 may be incorporated into Doherty PA circuit 106 to provide about 90 degrees of phase delay to the peaking input signal. For example, phase delay element 138 may include a quarter wave transmission line, or another suitable type of delay element, with an electrical length of about 90 degrees. To compensate for the resulting 90 degree phase delay difference between carrier and peaking amplification paths 114, 116 at the inputs of amplifier sections 108, 110, and thereby ensure that the amplified signals arrive in phase at combining node 118, the output-side circuit portion is configured to apply about a 90 degree phase delay to the signal between output of carrier amplifier 108 and combining node 118. This may be achieved through the provision of an additional delay element 140, which may or may not be contained in Doherty PA circuit 106 itself.

While Doherty PA circuit 106 has a standard load network configuration in the illustrated embodiment, other load network configurations are possible in alternative implementations. For example, in alternative implementations, Doherty PA circuit 106 may instead have an alternate (or "inverted") load network configuration. In this case, the input-side circuit portion may be configured such that an input signal supplied to carrier amplifier section 108 is delayed by about 90 degrees with respect to the input signal supplied to peaking amplifier section 110 at the center frequency of operation of Doherty PA circuit 106. Correspondingly, the output-side circuit portion may be configured to apply about a 90 degree phase delay to the signal between the output of peaking amplifier section 110 and combining node 118. In various implementations, power amplifier sections 108, 110 may each include a single-stage or multi-stage power transistor die(s) bonded to HTP substrate 22. Further, as noted above, the power amplifier sections 108, 110, as well as portions of impedance matching networks 130, 132, 134, 136, may be implemented in the form of Doherty PA circuit 106. Input and output matching networks 130, 132, 134, 136, or portions thereof, may be implemented as additional components within circuitry integrated within RF power dies 46, 48. Either or both of power amplifier sections 108, 110 may be implemented with multiple parallel amplification paths (rather than with a single amplification path) in more complex embodiments. For example, in an example asymmetric Doherty configuration, carrier amplifier section 108 may be implemented with two (or a greater number of) parallel amplification paths, while peaking amplifier section 110 is implemented with three (or some other number of) parallel amplification paths. Further, in the case of an N-way Doherty amplifier (N>2), Doherty PA circuit 106 may contain multiple peaking amplifiers of differing configurations or levels.

There has thus been described a Doherty PA circuit into which embodiments of RF package 20 (FIGS. 1-5) may be beneficially integrated when, for example, RF power dies 46, 48 assume the form of carrier and peaking PA dies bearing transistor-containing ICs utilized for RF signal amplification purposes. In other implementations, RF package 20 may be incorporated into another type of circuit, which may or may not be utilized for RF signal amplification purposes. Generally, then, the foregoing description is provided merely as a non-limiting example of an application in which RF package 20 may contain RF power dies having varying heat dissipation needs, with CTE matched mount pads 50, 52 of HTP substrate 22 potentially imparted with varying sizes and/or constructions to provide increased heat dissipation from and/or a decreased CTE mismatch with a given RF power die having a greater propensity for excess heat generation; e.g., as may be the case for RF power die 46 when serving as a carrier PA die in a Doherty PA circuit, such as that described below in connection with FIG. 6. This notwithstanding, embodiments of RF package 20 are not restricted to usage in any particular application or context; nor are embodiments of HTP substrate 22 limited to incorporation into a particular type of RF package. Rather, alternative embodiments RF package 20 and HTP substrate 22 can differ relative to the above-described example in any number of respects. For example, in further implementations, HTP substrate 22 may contain a single CTE matched mount pad having increased planform dimensions (relative to metallic base structure 30) to which multiple RF power dies are mounted; HTP substrate 22 may contain another type of metallic base structure, such as a PCB-embedded slug or coin, to which the CTE matched bond pad(s) are joined; and/or HTP substrate 22 may be incorporated into an RF package fabricated utilizing an electrically-routed substrate or a leadframe-based approach. Additional description in this regard is provided below in connection with FIGS. 11-14. First, however, an example manner in which HTP substrate 22 may be fabricated in parallel with a plurality of similar HTP substrates utilizing a large scale, array-based manufacturing process is discussed in connection with FIGS. 7-10.

Example Processes for Manufacturing HTP Substrates and Associated RF Packages

Figure 7:
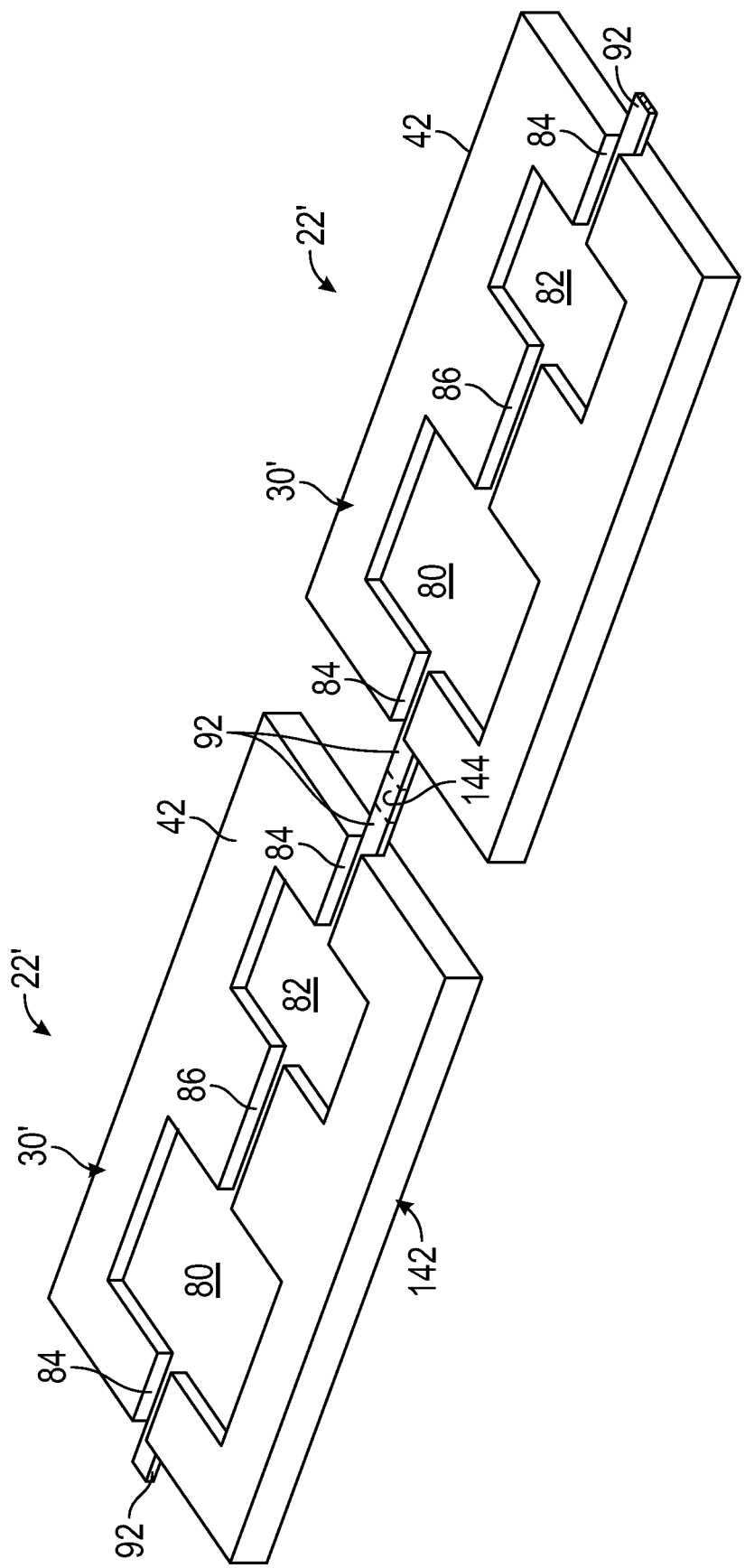
FIGS. 7-10 illustrate, in step-by-step sequence, an example fabrication method for manufacturing the HTP substrate shown in FIGS. 1-5 along with a number of similar or identical HTP substrates utilizing a large scale, array-based manufacturing approach.
Figure 8:
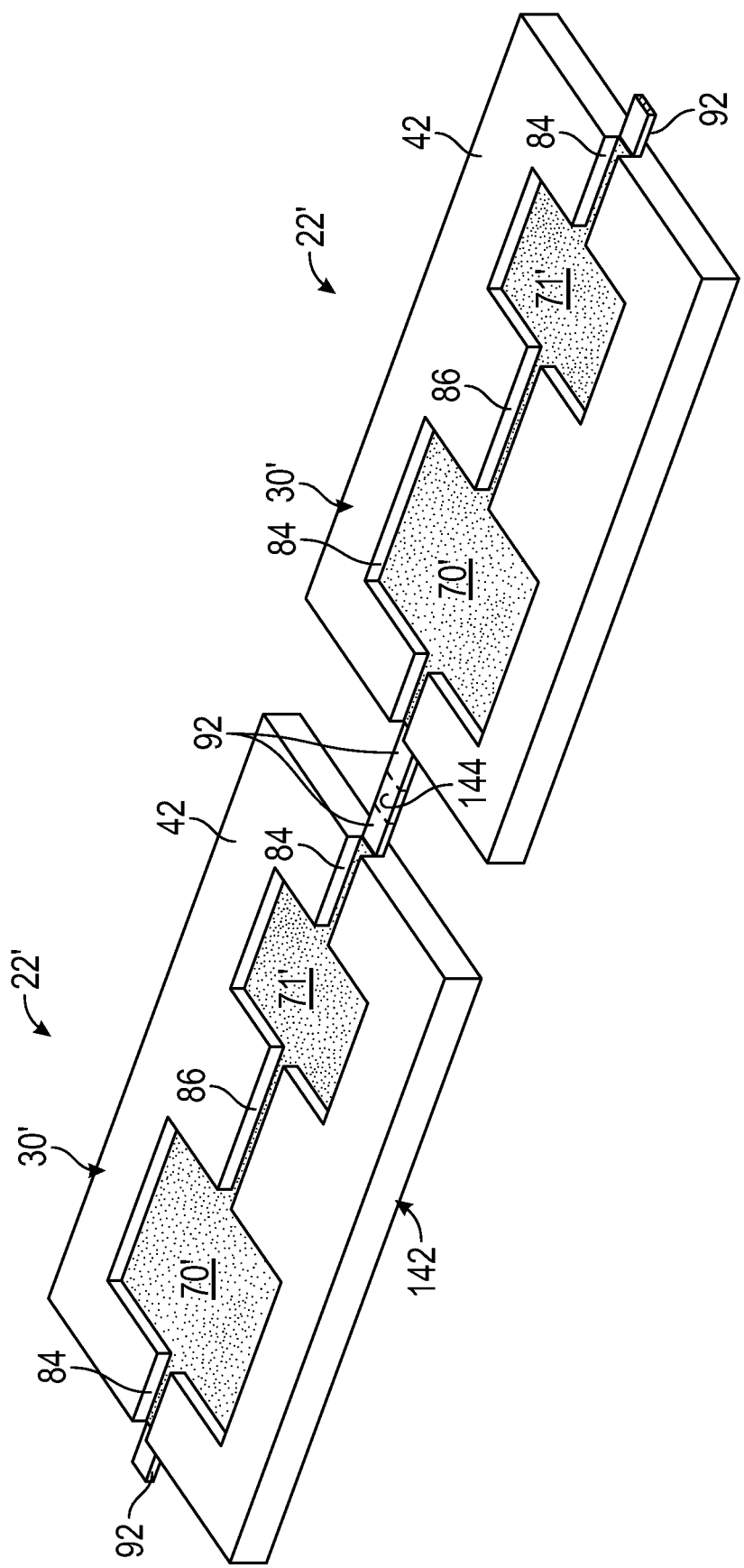
Figure 9:
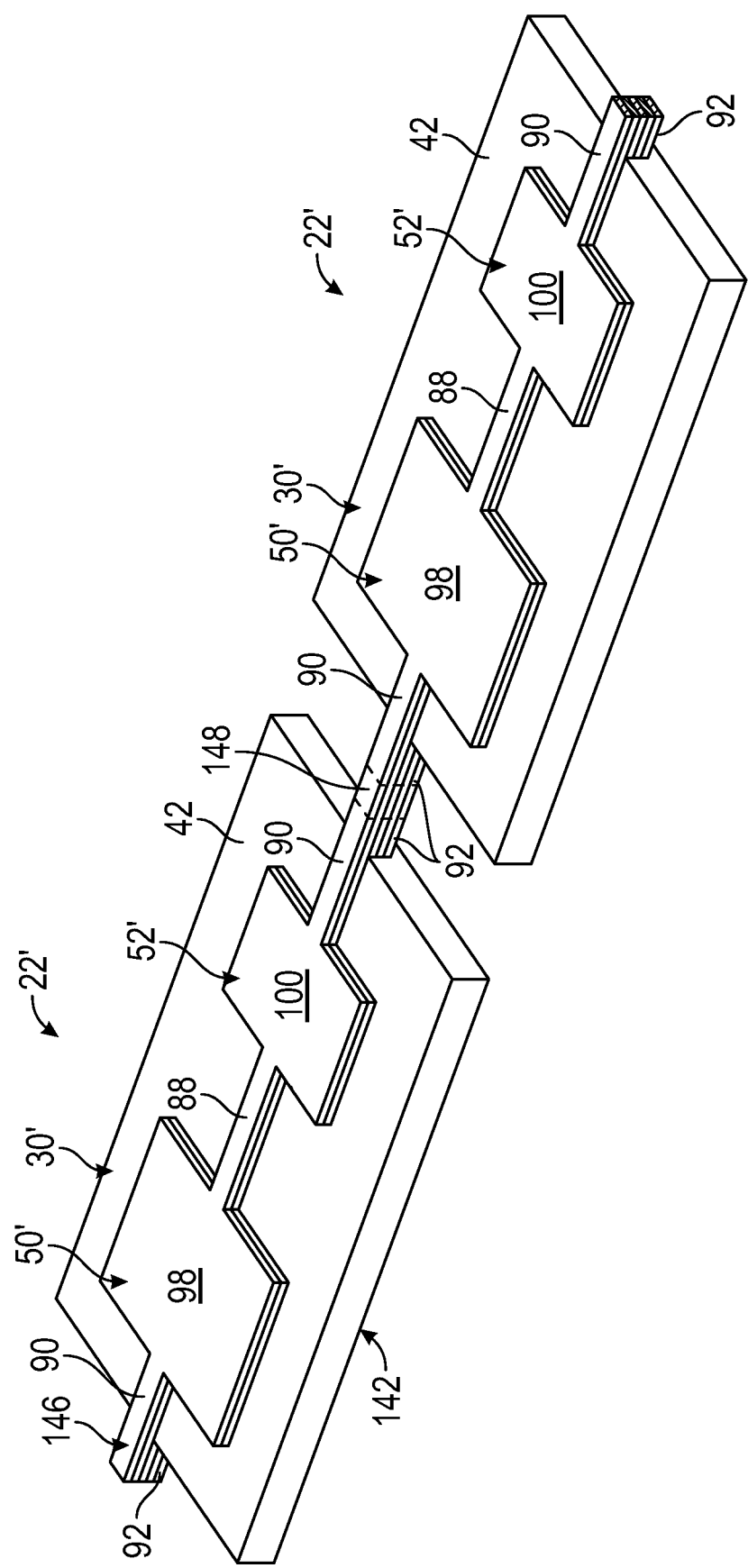
Figure 10:
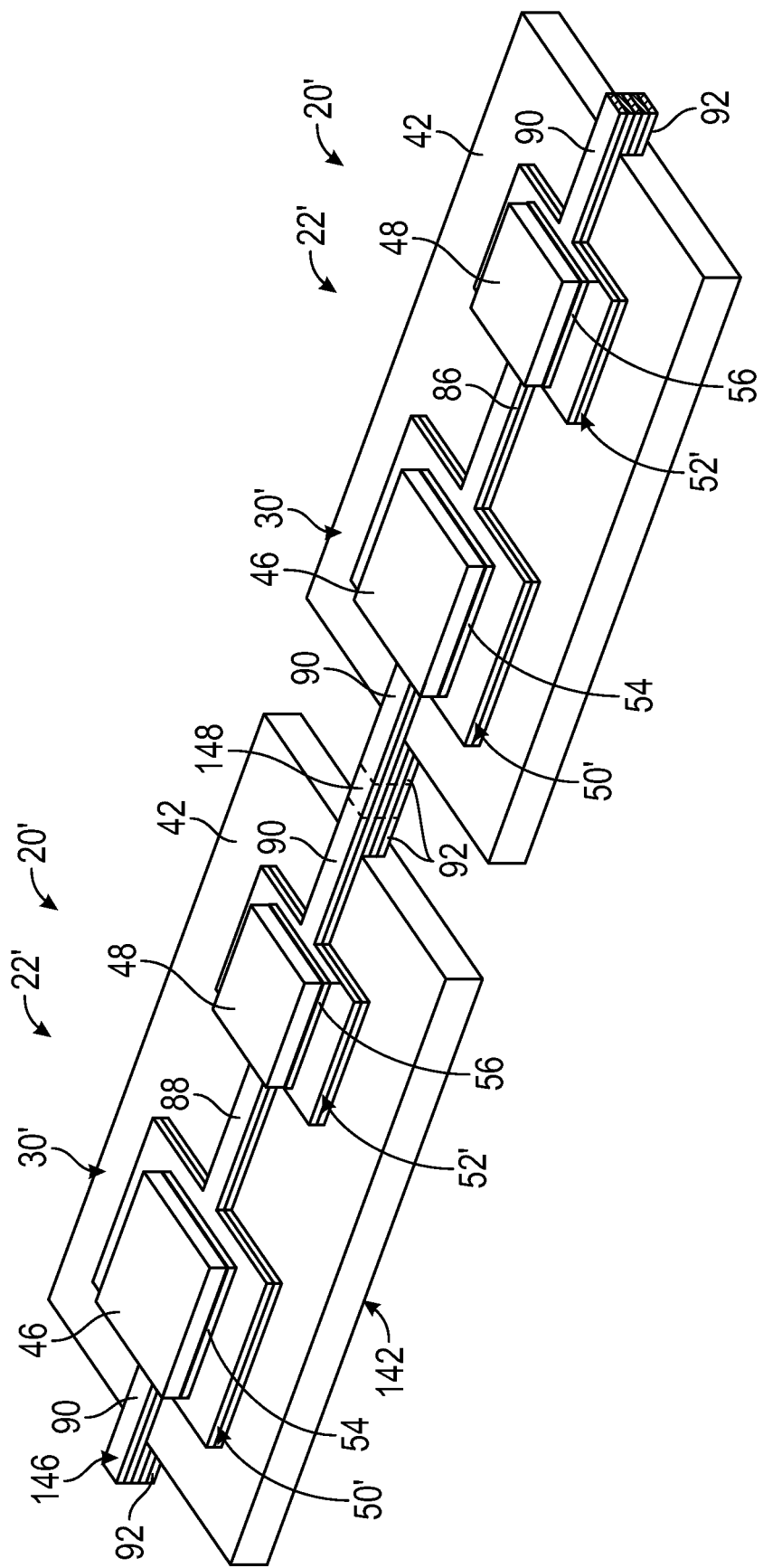

Turning now to FIGS. 7-9, two instances of HTP substrate 22 are shown at various stages of manufacture. Referring initially to FIG. 7, HTP substrates 22 are shown in an incomplete state of manufacture and identified by reference numeral "22'," the prime symbol (') appended to reference numerals when denoting structural elements in an incomplete or partially-fabricated state. In the illustrated embodiment, HTP substrates 22' are produced utilizing an array-based manufacturing approach. Specifically, HTP substrates 22' (and the below-described RF packages 20' produced utilizing HTP substrates 22') are fabricated utilizing an array of interconnected HTP substrates 22' having linear or strip layout. In this regard, the manufacturing process begins with purchasing, independently fabricating, or otherwise obtaining an elongated strip or linear array 142 of interconnected metallic base structures 30'; the prime symbol, as utilized here, indicating that base structures 30' presently exist in a physically-interconnected, pre-singulated format. In other instances, base structure array 142 (and the below-described mount pad array 146) may have a different layout or spatial distribution, such as an interconnected grid arranged in multiple horizontally-extending rows and columns. For illustrative clarity, only a limited region of a base structure array 142 is shown in FIGS. 7-9, noting that base structure array 142 (and CTE matched mount pad array 146) is significantly longer than the illustrated region and may encompass several dozen, if not several hundred instances of base structure 30', CTE matched mount pads 50', 52', and the other components included in each instance of RF package 20'.

Metallic base structures 30' are interconnected by tie bars 92, which project from base structures 30' in opposing longitudinal directions. At a location between adjacent pairs of base structures 30', tie bars 92 include sacrificial connecting regions 144 (one of which is shown in FIG. 7), which are removed during singulation of HTP substrates 22' and, perhaps, of the RF packages 20' if produced by processing HTP substrates 22' while remaining in an interconnected, pre-singulated format. As explained above, metallic base structures 30' may be fabricated as monolithic or laminate structures, which may be initially produced in a panel or sheet-like form and subsequently machined or otherwise processed to produce base structure array 142. Open cavities 80, 82 and interconnecting channels 84, 86 (hereafter collectively "recess features 80, 82, 84, 86") may be cut into or otherwise formed in the respective upper surfaces 42 of metallic base structures 30'. Recess features 80, 82, 84, 86 may help locate or physically pilot CTE matched mount pad array 146 onto base structure array 142. Additionally, in embodiments, recess features 80, 82, 84, 86 may be leveraged reservoirs or retaining regions into which volumes of a flowable bonding material may be dispensed and processed to form bonding layers 70, 71, which join corresponding pairs of CTE matched mount pads 50', 52' to base structures 30'. An example of such bonding material, deposited into recess features 80, 82, 84, 86 in a liquid or a dry (e.g., powder), is shown in FIG. 8 and identified by reference numerals 70', 71'. In various implementations, bonding material 70', 71' may be a sinter precursor material, a braze material, or a solder material, which is subsequently processed (e.g., subjected to any combination of elevated pressures and temperatures) to transform bonding material 70', 71' into bonding layers 70, 71 after positioning of CTE matched mount pads 50', 52' relative to base structures 30' positions and in contact with bonding material 70', 71'. In other instances, pairs of CTE matched mount pads 50', 52' may be joined to the corresponding base structures 30' included in base structure array 142 in a different manner, such as by diffusion bonding, in which case bonding material 70', 71' may be omitted. Additional description of diffusion bonding processes suitable for joining CTE matched mount pads to underlying metallic base structures is described below in connection with FIGS. 11 and 12.

As previously indicated, bond layers 70, 71 may be formed as sintered bodies or joints in embodiments, in which case bonding material 70', 71' may be supplied as a sinter precursor material. In such embodiments, bonding material 70', 71' is conveniently applied utilizing either a wet state or dry state (e.g., film) application technique. For example, in one approach, a sinter precursor material may be applied (e.g., by spraying or dipping) to the lower surfaces of base structure array 142 (shown in FIG. 9), with base structure array 142 then positioned to insert CTE matched mount pads 50, 52 into the corresponding open cavities 80, 82 included in each instance of metallic base structure 30'. In other instances, and as generally shown in FIG. 8, such a sinter precursor material is initially deposited into cavities 70', 71' in a wet state utilizing a suitable deposition technique, such as a fine needle dispense technique. When a wet state application technique is employed, a flowable or wet state coating precursor material is initially obtained by, for example, independent production or purchase from a third party supplier. The selected sinter precursor material may be formulated to contain metal particles, a liquid carrier, a dispersant, and other constituents. The metallic particles contained in the sinter precursor material may have any shape and average dimensions of the metal particles will vary in conjunction with particle shape and process parameters. As a specific, albeit non-limiting example, the sinter precursor material may contain at least one of Ag, Au, or Cu nanoparticles in an embodiment. In addition to metal particles, the wet state coating precursor material contains other ingredients (e.g., a solvent and/or surfactant) to facilitate wet set application, to adjust precursor material viscosity, to prevent premature agglomeration of the metal particles, or to serve other purposes. In embodiments, the wet state coating precursor material contains metal particles in combination with a binder (e.g., an epoxy), a dispersant, and a thinner or liquid carrier. The volume of solvent or liquid carrier contained within the coating precursor material can be adjusted to tailor of the viscosity of the precursor material to the selected wet state application technique. After application of the wet state coating material, a drying process can be carried-out to remove excess liquid from the metal particle-containing sinter precursor material, if so desired.

Next, a strip or linear array 146 of interconnected CTE matched mount pads 50', 52', which is shaped and dimensioned for a close-fit relationship with base structure array 142, is positioned over base structure array 142 as shown in FIG. 9. In particular, mount pad array 146 is seated onto base structure array 142 in a manner inserting CTE matched mount pads 50', 52' into their corresponding open cavities 80, 82, contacting with bonding material 70', 71'. Bond pad array 146 may be pressed toward base structure array 142 utilizing a suitable fixture or mechanism (e.g., a hydraulic press or rollers) to ensure that CTE matched mount pads 50', 52' are fully seated in cavities 80, 82. Peripheral tie bars 90 extending outwardly from adjacent pairs of mount pads 50', 52' are joined by sacrificial connector regions 148. Sacrificial connector regions 148 of mount pad array 146 overlap vertically with sacrificial connector regions 144 of base structure array 142 and are removed, along with connector regions 144, when HTP substrates 22' are singulated. After positioning of mount pad array 146 over base structure array 142, elevated temperatures, elevated pressures, or a combination thereof may be applied to transform bonding material 70', 71' into bond layers 70, 71 mechanically, thermally, and electrically coupling mount pad pairs 50', 52' to the corresponding base substrates 30'.

The particular manner in which bonding material 70', 71' is processed to produce bond layers 70, 71 in a given embodiment will depend, at least in part, on the composition of the bonding material. When bonding material 70', 71' is composed of a solder, sufficient temperatures may be applied to reflow bonding material 70', 71' and form bond layers 70, 71 (here, solder joints) joining CTE matched mount pads 50', 52' to metallic base structures 30'. Similarly, when composed of a braze material, arrays 142, 146 may likewise be exposed to elevated temperatures to transform bonding material 70', 71' into bond layers 70, 71, with the heating schedule chosen based upon the braze material utilized. For example, if a Cu—Ag braze material is utilized, higher temperature sintering may be conducted at maximum temperatures approaching or exceeding 780° C. In other instances, lower temperature braze systems may be employed, such as braze systems containing Au, tin, germanium, or the like. Finally, when bonding material 70', 71' is composed of a sinter precursor material, curing may be performed through low temperature heating (with or without the application of elevated pressures) to transform the sinter precursor material into sinter bond layers forming metallurgical bonds at the various interfaces between CTE matched mount pads 50', 52' and underlying base structures 30'. The resulting bonding layers 70, 71 may be formed from sintered metallic particles and predominately composed of one or more metallic constituents, by weight. When formed from such sintered materials, the bond layers may be predominately composed of Cu, Ag Au, or a mixture thereof, by weight. Also, in such instances, the sintered bonds layers may or may not contain organic materials, such an epoxy added for strengthening purposes.

Following attachment of CTE matched mount pads 50', 52' to metallic base structures 30', the process steps dedicated to the fabrication of HTP substrates 22' are largely complete. In certain instances, HTP substrates 22' may be singulated at this juncture to remove sacrificial connecting regions 148 from mount pad array 146, to remove vertically-overlapping connecting regions 144 from base structure array 142, thereby separating HTP substrates 22 into singulated (individual or discrete) units. Suitable singulation processes include water jetting, laser cutting, and sawing utilizing a dicing saw. In other instances, additional processing steps may be performed to commence, and perhaps to complete or to substantially complete, RF package fabrication prior to singulation of the array containing physically-connected HTP substrates 22'. This may be appreciated by reference to FIG. 10, which further illustrates the initial stages of RF package fabrication performed utilizing the newly-produced HTP substrates 22', as provided in an array format prior to HTP substrate singulation. RF power dies 46, 48 may be attached to the appropriate CTE matched mount pads 50', 52' utilizing a selected thermally- and electrically-conductive bonding material, such as a solder material, a sintered material, or a metal particle-containing die attach material, as previously described.

After RF power die attachment, additional process steps may be conducted to continue fabrication of RF packages 20', such as overmolding (e.g., through transfer molding), wire bonding, and lidding operations. Any or all of such steps may be carried-out prior to singulation of arrays 142, 146 for process efficiency; or one or more of the manufacturing steps utilized to complete fabrication of RF packages 20' steps may be conducted following singulation of arrays 142, 146 in other instances. In embodiments in which overmolding is conducted prior to separation of arrays 142, 146, singulation is conveniently accomplished by directing a dicing saw through saw lanes encompassing sacrificial regions 144, 148, as well as any overmold material present within the saw lanes, to separate RF packages 20' into singulated or individual units. Singulation may result in the formation of package sidewalls to which tie bars 90, 92 extend and terminate. In particular, for each singulated unit, tie bars 90 may extend from CTE matched mount pads 50, 52 in opposing directions to terminate at the package sidewalls, with each tie bar 90 imparted with a singulated terminal end that may be substantially coplanar or flush with the corresponding package sidewall. Similarly, tie bars 92, which extend from metallic base structure 30 and underly tie bars 90, extend to and terminate at the package sidewalls created by singulation. Following array singulation, any needed additional processing steps and testing procedures may be performed to produce complete RF packages similar or identical to RF package 20 discussed above in connection with FIGS. 1-5.

Additional Examples of HTP Substrates Contained in RF Packages

The foregoing has thus described RF packages containing HTP substrates, which include CTE matched mount pads minimizing CTE mismatch between metallic base structures and RF power dies, and possibly other packaged microelectronic components, which may be prone to excess heat generation during package operation. In the above-described example embodiments, the metallic base structures assume the form of metallic base flanges, while the RF packages are fabricated as lidded air cavity packages. The foregoing also disclosed example manufacturing process beneficially employed in fabricating such HTP substrates and RF packages, generally, utilizing an efficient, large scale, array-based manufacturing approach. The above-described examples notwithstanding, the HTP substrates may assume other forms and may be incorporated into various other RF package types in further implementations. Additionally, embodiments of the HTP substrates may be fabricated utilizing various other manufacturing processes, including utilizing processes facilitating the formation of diffusion bonds between the CTE matched mount pads and the underlying metallic base structure contained within a given implementation of the HTP substrate. Further description in this regard will now be provided in connection with FIGS. 11 and 12, while examples of alternative types of RF packages into which alternative embodiments of the HTP substrate are advantageously incorporated are discussed below in connection with FIGS. 13 and 14.

Figure 11:
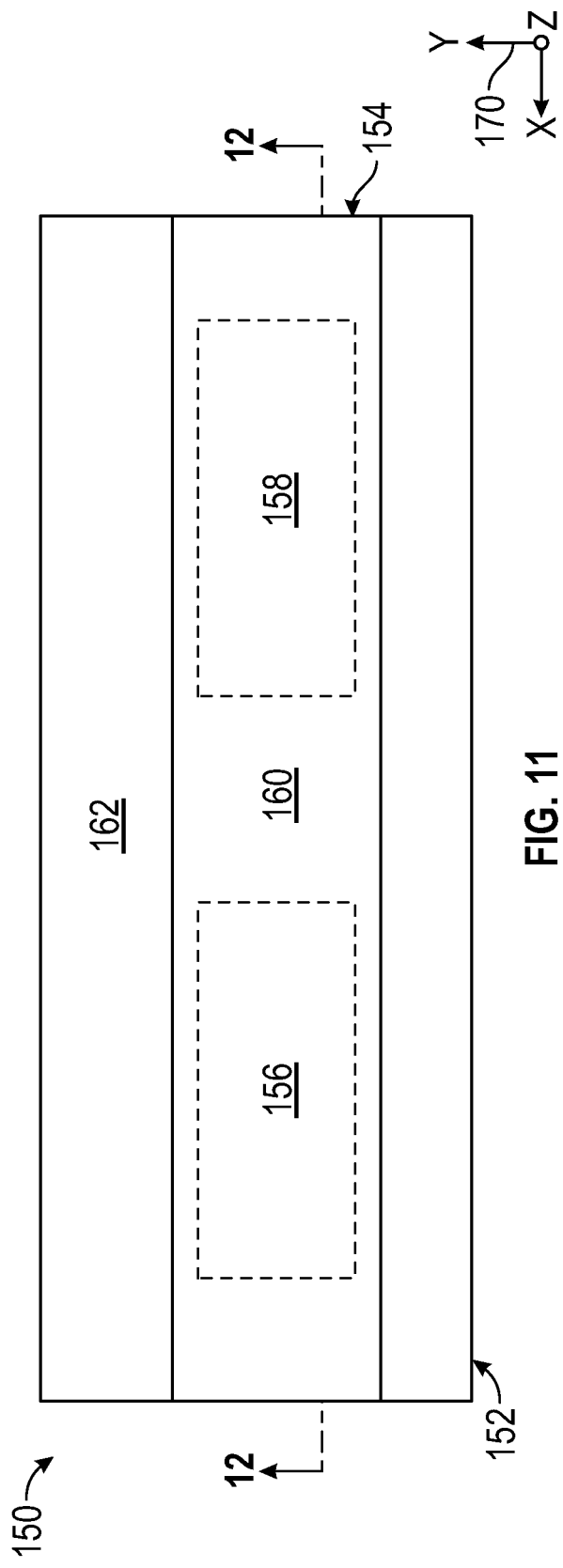
FIGS. 11 and 12 are planform (top-down) and cross-sectional views, respectively, of an HTP substrate containing a CTE matched mount pad or inlay having an upper die support surface, which is substantially coplanar with the upper surface of a metallic base structure (here, provided as a metallic base flange)
Figure 12:
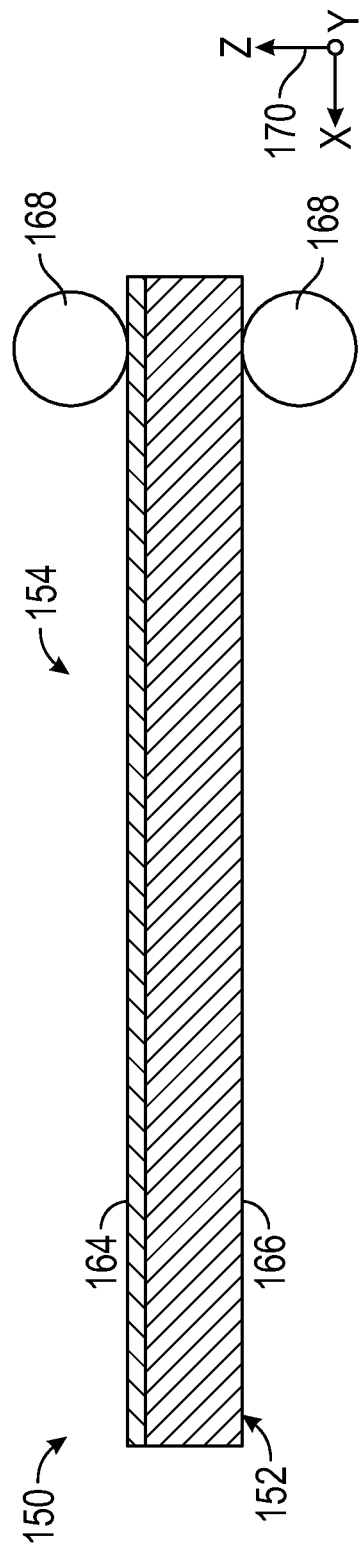

Advancing to FIGS. 11 and 12, there is shown an HTP substrate 150 including a metallic base structure 152 in which a single, relatively lengthy CTE matched mount pad 154 is embedded as an inlay feature. Here, HTP substrate 150 is imparted with a relatively straightforward construction to, for example, facilitate cost effective manufacture of multiple HTP substrates by processing of a larger panel or strip of material. In this regard, CTE matched mount pad 154 is imparted with a longitudinally-elongated rectangular planform geometry, including a substantially consistent width (as measured along the Y-axis of coordinate legend 170) and a substantially constant thickness (as measured along the Z-axis of coordinate legend 170). CTE matched mount pad 154 spans the length of metallic base structure 152 and is set or inserted into a longitudinal channel formed in an upper surface or frontside 162 of base structure 152. The longitudinal channel formed in base structure 162 likewise spans the length of base structure 152 and has a depth and width substantially equivalent to the corresponding dimensions (the length and height or thickness) of mount pad 154. By virtue of this construction, an upper die support surface 160 of CTE matched mount pad 154 is substantially coplanar with upper surface 162 of metallic base structure 152; however, the upper surface of mount pad 154 may extend slightly above or be recessed slightly below frontside 162 of base structure 152 in other implementations. Two die attach regions 156, 158 are further provided on die support surface of CTE matched mount pad 154, as shown in phantom in FIG. 11; with suitable microelectronic components (e.g., RF power dies similar to RF power dies 46, 48 shown in FIGS. 1-10) attached to these regions utilizing thermally-conductive and possibly electrically-conductive bonding material, such as a solder or sintered material, when HTP substrate 150 is integrated into a larger RF package.

Metallic base structure 152 may have a monolithic construction, a multilayer construction, or another construction rendering base structure 152 suitable for service as a thermally-conductive heatsink and, perhaps, an electrically-active structure or terminal of the RF package into which HTP substrate 150 is ultimately incorporated. So too may elongated, CTE matched mount pad 154 have a monolithic or multilayer construction imparting CTE matched mount pad 154 with a CTE less than that of base structure 152 and greater than the respective CTEs of the RF power dies subsequently mounted to regions 156, 158 of HTP substrate 150 in a manner analogous to that previously described. In certain embodiments, and as discussed above in connection with CTE matched mount pads 50, 52 of RF package 20 (FIGS. 1-10), metallic base structure 152 may assume the form of either a monolithic or multilayer structure, which contains a greater weight percentage of Cu (and may be predominately composed of Cu by weight); while CTE matched mount pad 154 is formed as a monolithic strip composed of a material, such as a Mo alloy or Cu—Mo alloy, having a lower Cu content (potentially containing little to no Cu) and higher Mo content than does base structure 152, by weight. In still other instances, CTE matched mount pad 154 may be composed of another thermally-conductive material having a CTE less than that of metallic base structure 152, or mount pad 154 may be imparted with a multilayer construction similar or identical to that discussed above in connection with CTE matched mount pads 50, 52 contained in HTP substrate 22 discussed above in connection with FIGS. 1-5. In embodiments, CTE matched mount pad 154 may be bonded to metallic base structure 152 utilizing a sintered material, a braze material, a solder, or another thermally-conductive bonding material as previously described. In other instances, CTE matched mount pad 154 may be joined to metallic base structure 152 by diffusion bonding, as described immediately below.

In embodiments in which CTE matched mount pad 154 is diffusion bonded to metallic base structure 152, the formation of diffusion bonds at the mount pad-base structure interface is facilitated in the case of HTP substrate 150, noting again that upper surface 160 of CTE matched mount pad 154 may be substantially coplanar with upper surface 162 of metallic base structure 152. CTE substrate 150 may be processed utilizing a hydraulic press, a system of rollers 168 (FIG. 12), or a similar equipment arrangement utilized to exert sufficient convergent pressure urging CTE matched mount pad 154 toward metallic base structure 152, typically in combination with highly elevated temperatures, to create the desired diffusion bonds at the appropriate structural interfaces. Due, at least in part, to the elongated rectangular geometry of the channel formed in frontside 162 of metallic base structure 152, multiple longitudinally-aligned channels can be readily formed in a corresponding number of metallic base structures, which are initially joined or physically interconnected in an end-to-end relationship as a larger structure; e.g., as an elongated base structure strip, which extends along the X-axis of coordinate legend 170 shown in the lower right corners of FIGS. 11 and 12. In one manufacturing approach, elongated channels may be formed in multiple base structures 152 by creating a single, continuous cut (e.g., utilizing a suitable CNC or EDM tool) along the length of an elongated rectangular strip or preform, such as a metal extrusion, which is subsequently singulated into individual base structures 152. Alternatively, the channels into which mount pads 154 are inserted may be formed as features integral to the base structures when the base structures are initially formed as a linear array via an extrusion with the approach cross-sectional geometry. In still other instances, a stamping technique may be employed. Regardless of the particular manufacturing approach employed, a second elongated strip (herein, a mount pad strip) can then be laid or set into the channel extending lengthwise along the base structure strip and bonded in place to concurrently produce a relatively large number of integrally-joined HTP substrates. The resulting HTP substrates may then be singulated at a suitable juncture of manufacture; and, if desired, subject to further processing to commence RF package manufacture in a manner analogous to that described above in connection with FIG. 10.

Figure 13:
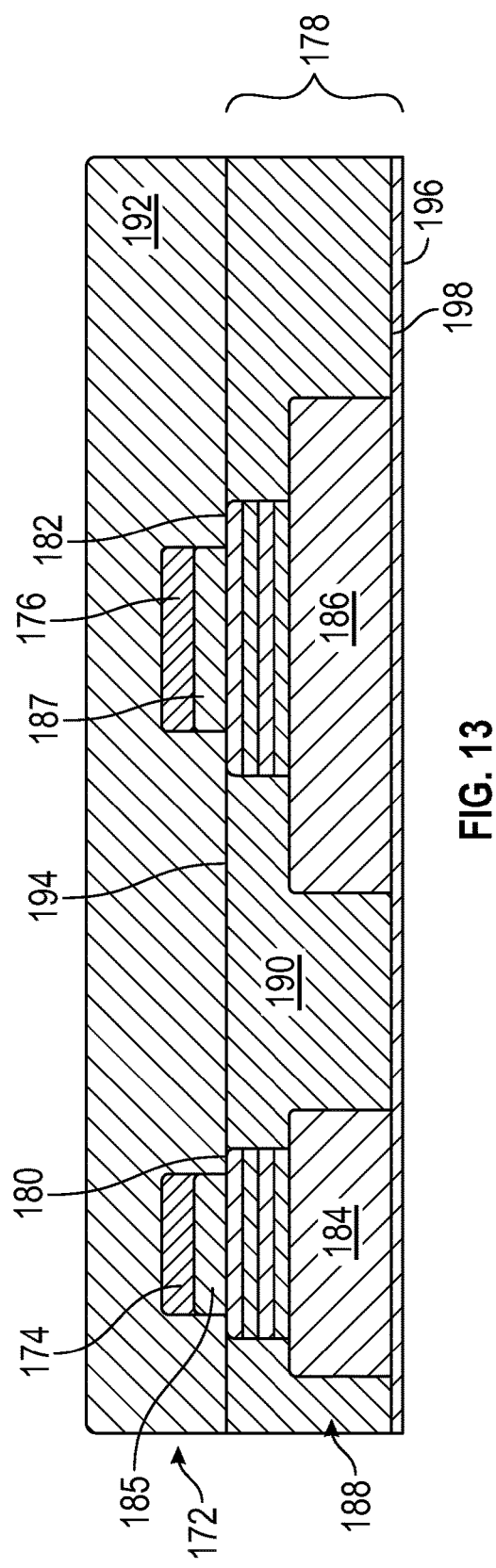
FIG. 13 is a simplified cross-sectional of a PA package containing RF power dies and an HTP substrate including a dielectric body, metallic base structures in the form of embedded metallic coins, and CTE matched mount pads bonded to the base structures, as illustrated in accordance with a further example embodiment.

Turning next to FIG. 13, a further example RF package 172 is shown as a simplified schematic, with package 172 again containing two RF power dies 174, 176 supported by an underlying HTP substrate 178. Specifically, RF power dies 174, 176 are mounted to CTE matched mount pads 180, 182 included in HTP substrate 178 utilizing two electrically- and thermally-conductive bond layers 185, 187, respectively. Opposite RF power dies 174, 176, CTE matched mount pads 180, 182 are bonded to metallic base structures 184, 186, which has a lower surface which is substantially coplanar with the bottomside of RF package 172. In contrast to the embodiments discussed above in connection with FIGS. 1-12, CTE matched mount pads 180, 182 and metallic base structures 184, 186 of HTP substrate 178 are embedded in a dielectric encapsulant body 188, such as glob top epoxy or a molded thermoplastic, in a manner similar to an embedded coin. Dielectric body 188 has an inboard or upper die-facing surface or frontside 194, which is substantially coplanar with the respective upper surfaces of mount pads 180, 182 in the illustrated example. In other embodiments, the upper mount pad surfaces may be slightly recessed below or extend upwardly beyond the upper surface of dielectric body 188 in other implementations. CTE matched mount pads 180, 182 may have non-layered (monolithic) constructions; or, instead, mount pads 180, 182 may be imparted with layered constructions, as shown. In the latter case, for example, CTE matched mount pads 180, 182 may each include at least a first Cu layer bonded to at least one Mo or Cu—Mo layer; e.g., mount pads 180, 182 may each include an intermediate Mo or Cu—Mo layer bonded between two Cu layers. In such embodiments, the Mo or Cu—Mo layer (or layers) included in each mount pad 180, 182 may contain a lesser weight percentage of Cu and a greater weight percentage of Mo than does the Cu layer or layers (which may be substantially free of Mo in at least some instances).

In a manner similar to CTE matched mount pads 180, 182 metallic base structures 184, 186 be imparted with non-layered or layered constructions, providing CTE matched mount pads 180, 182 each have a CTE less than metallic base structures 184, 186, respectively, and greater than RF power dies 174, 176. In one embodiment, metallic base structures 184, 186 each assume the form a metallic (e.g., Cu) coin or block; while, in other instances, base structures 184, 186 may be produced from a composite or layered material having relatively high thermal and electrical conductivities. Comparatively, CTE matched mount pads 180, 182 may each be imparted with a layered construction in the illustrated embodiment. In this case, CTE matched mount pads 180, 182 may each include at least one layer or set of layers having a first Mo content and a first Cu content; and a second layer or set of layers having a second Mo content less than the first Mo content and a second Cu content greater than the first Cu content by weight. In other implementations, metallic base structures 184, 186 may be imparted with a layered construction as previously described, while CTE matched mount pads 180, 182 may have a monolithic or non-layered constructions. Further, in certain cases, CTE matched mount pads 180, 182 may each be produced to include plated metal surfaces or coatings (e.g., Ag-containing surface finishes formed by electroplating) promoting the formation of high integrity, low electrical resistance bonds at the interfaces between mount pads 180, 182 and metallic base structures 184, 186.

With continued reference to FIG. 13, dielectric body 188 of a HTP substrate 178 may assume the form of coreless substrate or a machinable dielectric (e.g., ceramic) block in alternative embodiments. In other instance, dielectric body 188 is a single layer or multi-layer PCB further including electrically-conductive routing features, such as metallic (e.g., Cu) traces, plated or filled vias, ground planes, and the like. For example, in this regard, dielectric body 188 may be a multilayer PCB having routing features, such as vias and metallic (e.g., Cu) traces, within intermediate region 190 located between CTE matched mount pads 180, 182 and between metallic base structures 184, 186. Such a layout may increase the wiring or circuit density of RF package 172, allowing RF package 172 to be reduced in size. RF package 172 may also include other features, such as an overmold body 192 encapsulating dies 174, 176 and bonded to an upper die support surface 194 of HTP substrate 178. A backmetal layer 196 may further be formed over backside 198 of HTP substrate 178. When formed backmetal layer 196 may be a continuous metal layer (e.g., a ground plane)

or a patterned metal layer. For example, in embodiments, backmetal layer 196 may be a ground plane, which is plated or otherwise deposited over the backside of PA package 172 and formed in contact with metallic base structures 184, 186, as shown. In such instances, RF power dies 174, 176 may each include terminals (e.g., source terminals) electrically coupled to backmetal layer 196 through bonding material layers 185, 187, through CTE matched mount pads 180, 182, and through metallic base structures 184, 186, with backmetal layer 196 serving as both an electrically-conductive (e.g., ground) terminal and thermal interface of RF package 172.

In the above-described manner, HTP substrate 178 enables excess heat generated by RF power dies 174, 176 to be dissipated by conduction away from dies 174, 176, through CTE matched mount pads 180, 182, through metallic base structures 184, 186, and to the backmetal layer 196 exposed from the exterior of RF package 172. When installed within a larger system or assembly, and as indicated above, backmetal layer 196 may serve as a thermal interface placed in thermal communication with a system-level heatsink, such as an air-cooled metal chassis or fin array. Additionally, the combination of CTE matched mount pads 180, 182 and corresponding metallic base structures 184, 186 cooperate to form low thermal resistance inverted T-shaped structures, which increase in volume when moving away from RF power dies 174, 176 and toward the backmetal layer 196 and, therefore, toward the lower principal surface or backside of RF package 172. This provides an increased heat spreading functionality to further enhance heat removal from RF power dies 174, 176. Concurrently, the volume of higher cost materials contained within HTP substrate 178 may be reduced to minimize overall material costs associated with incorporation of HTP substrate 178 into RF package 172 as compared to, for example, a multilayer flange of equivalent dimensions. During manufacture, CTE matched mount pads 180, 182 may be initially produced and bonded to metallic base structures 184, 186 utilizing an independent fabrication process. More specifically, in one possible approach, relatively large sheets or panels (embodying multiple instances of CTE matched mount pads 180, 182 and multiple instances of metallic base structures 184, 186) may be joined utilizing the processes similar to those described above and singulated to yield T-shaped units, which are then incorporated into a PCB (or similar substrate) utilizing processes similar to those currently employed for forming PCBS having embedded coins. In other embodiments, a different fabrication technique may be employed to produce HTP substrate 178 and RF package 172.

Figure 14:
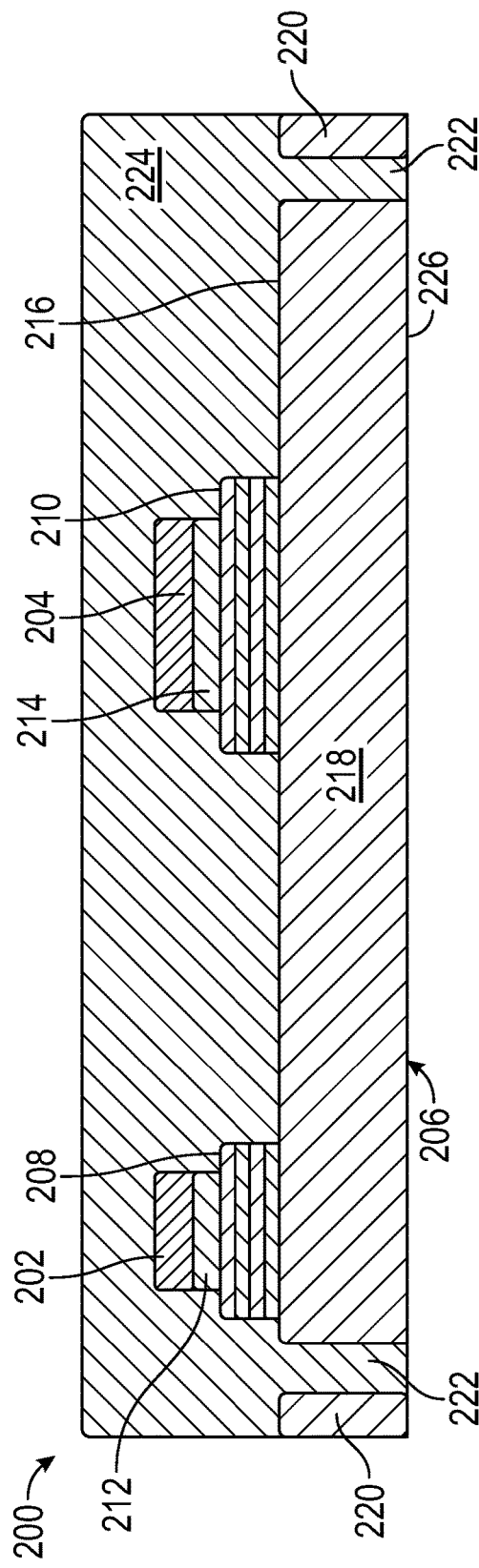
FIG. 14 is a simplified cross-sectional of a PA package containing RF power dies and an HTP substrate including a dielectric body, a metallic base structure in the form of a leadframe die attach pad, and CTE matched mount pads bonded to the die attach pad, as illustrated in accordance with a further example embodiment of the present disclosure.

Referring lastly to FIG. 14, a further example embodiment of an RF package 200, which contains two RF power dies 202, 204 bonded to an underlying HTP substrate 206, is depicted in a simplified cross-sectional form. In a manner similar to HTP substrate 22 (FIGS. 1-10) and HTP substrate 178 (FIG. 13), HTP substrate 206 includes two CTE matched mount pads 208, 210 to which RF power dies 202, 204 are attached utilizing bond layers 212, 214. As was previously the case, bond layers 212, 214 are composed of an electrically-conductive and thermally-conductive material, such as solder, a sintered material, or a metal particle-containing die attach material. Opposite RF power dies 202, 204, CTE matched mount pads 208, 210 are bonded to the upper principal surface or die-facing frontside 216 of at least one underlying metallic base structure 218, with mount pads 208, 210 projecting upwardly from frontside 216 as raised, pedestal-like features. In this particular example, metallic base structure 218 assumes the form of a non-routed metal block or "die attach pad" provided in a leadframe format, with metallic base structure 218 more specifically referred to hereafter as "die attach pad 218." In addition die attach pad 218, leadframe 218, 220 further includes embedded terminals or contact pads 220, which are spaced in rows extending adjacent to the peripheral sidewalls of die attach pad 218. An overmold body 224 is formed around the packaged components (here, RF power dies 202, 204), the interconnect features (e.g., non-illustrated wire bonds), and the upper and peripheral surfaces of die attach pad 218. RF package 200 may consequently assume the form of a flat no-lead package, such as a QFN or DFN package, in the illustrated example. Leadframe 218, 220, and thus die attach pad 218 and contact pads 220, may be composed of a metallic material, such as Cu, in embodiments. Comparatively, CTE matched mount pads 180, 182 may be layered or laminate structures, as shown, composed of alternating metallic layers (e.g., alternating Cu and Cu—Mo layers) imparting mount pads 180, 182 with CTEs less than that of die attach pad 218 and greater than the respective CTEs of RF power dies 174, 176. In other instances, CTE matched mount pads 180, 182 may be non-layered structures composed of a suitable metallic or composite material (e.g., Mo or a Cu—Mo alloy) or another electrically- and thermally-conductive material having a CTE falling with in the desired range.

A lower surface 226 of die attach pad 218 is exposed through the bottomside or lower principal surface of RF package 200 and may be substantially coplanar therewith. Lower surface 226 of die attach pad 218 may thus serve as the thermal interface of RF package 200 and may be placed in thermal communication with a system-level heatsink when RF package 200 is installed within a larger electronic system or assembly. Excess heat generated by RF power dies 202, 204 may consequently be extracted from the interior of RF package 200, conducted through HTP substrate 206 (and, specifically, through CTE matched mount pads 208, 210 and metallic base structure 218), and to the system-level heatsink for transfer to the surrounding environment. Further, the combination of CTE matched mount pads 208, 210 and die attach pad 218 (generally, a "metallic base structure") further serves as a dual-topped coin to effectively provide an increased heat spreading function, which may further improve the overall thermal performance or heat dissipation capabilities of RF package 200. Such enhance heat dissipation capabilities may be particularly beneficial when one or both of RF power dies 202, 204 are prone to excess heat generation during operation of RF package 200 due to, for example, operation at higher frequencies or power levels and/or fabrication of RF power dies 202, 204 utilizing a layered GaN (e.g., a GaN/SiC) die substrate or another die technology having a relatively high power density. Concurrently, the exposed lower surface 226 of die attach pad 218 may serve as a (e.g., ground) terminal of RF package 200, with HTP substrate 206 providing a low electrical resistance connection to terminal (e.g., source terminals) of RF power dies 202, 204 when assuming the form of PA dies bearing FETs utilized for RF signal amplification purposes, as previously described.

CONCLUSION

The foregoing has thus described RF packages containing unique high thermal performance (HTP) substrates. Embodiments of the HTP substrate include one or more CTE matched mount pads, which are fabricated to minimize CTE mismatch between the RF power dies (and possibly other heat-generating components) attached to the mount pads and an underlying metallic base structure to which the mount pads are bonded, whether by diffusion bonding or utilizing a suitable bonding material. In so doing, the CTE matched mount pads minimize thermally-driven mechanical stressors occurring at the die-substrate interfaces to reduce the likelihood of structural compromise at these key interfaces and enhance the reliability of the RF package over time. Embodiments of the HTP substrate are further well-suited for integration into a wide range of RF package types and provide not only efficient heat removal from packaged RF dies, but also create a low electrical resistance path from the RF power dies to the metallic base structure; e.g., serving as a terminal of RF package, such as a ground terminal of the RF package, or otherwise providing electrical connection to a backside ground plane in embodiments. In certain instances, the CTE matched mount pads may be tailored by design (e.g., through variations in dimensions or composition) to provide individualized heat removal characteristics optimized for specific RF power die types, such as increased heat removal capabilities in the case of a carrier PA die included in a Doherty PA circuit. As a still further advantage, embodiments of the HTP substrate are resistive to dimensional changes, such as flatness deviations resulting from warping, observed in certain multilayer flanges; and may contain reduced amounts of costly materials little to no degradation to substrate thermal performance. Finally, embodiments of the HTP substrate can be fabricated and integrated into RF packages in a cost effective manner when, for example, array-based manufacturing techniques are employed to manufacture a relatively large number of HTP substrates, and possibly RF packages, in parallel.

Embodiments of the RF package contains an HTP substrate including a metallic base structure, which has a frontside facing a first RF power die and a first die attach region located on the frontside of the base structure; the die attach region denoting the surface area of metallic base structure underlying the die footprint, as viewed looking downwardly on the HTP substrate. A first CTE matched mount pad is bonded to the metallic base structure and covers the first die attach region. The first CTE mount pad has a CTE greater than that of RF power die and less than that of the metallic base structure. An electrically-conductive bonding material attaches the RF power die to the first CTE matched mount pad, while RF circuitry integrated into first RF power die is electrically coupled to the metallic base structure through the first CTE matched mount pad. In certain instances, the first CTE matched mount pad projects upwardly from the frontside of the metallic base structure to form a raised pedestal feature to which the first RF power die is mounted. Additionally or alternatively, the metallic base structure may include an open cavity into which the first CTE matched mount pad is inserted such that the first CTE matched mount pad is at least partially embedded in the metallic base structure. In still other instances, the first CTE matched mount pad has a die-support surface that is substantially coplanar with an outer terminal surface of the frontside of the metallic base structure.

Methods for fabricating RF packages containing HTP substrates having CTE matched mount pads have also been disclosed. In implementations, the method includes the steps or processes of: (i) obtaining a first RF power die having a die CTE; (ii) attaching the first RF power die to a first CTE matched mount pad included in an HTP substrate, the first CTE matched mount pad bonded to a metallic base structure having a base structure CTE and having a mount pad CTE greater than the die CTE and less than the base structure CTE; and (iii) in conjunction with attaching the first RF power die to the first CTE matched mount pad, electrically coupling PA circuitry formed on first RF power die to the metallic base structure through the first CTE matched mount pad. In certain implementations in which the RF circuitry includes or assumes the form of a FET having a source terminal, the step of electrically coupling entails electrically coupling the source terminal of the FET to the metallic base structure through the first CTE matched mount pad. In other implementations in which the first RF power die assumes the form of a peaking RF power die, the method includes the additional steps of: (i) attaching a carrier RF power die to a second CTE matched mount pad included in a HTP substrate; and (ii) in conjunction with attaching the carrier RF power die to the second CTE matched mount pad, electrically coupling RF circuitry formed on carrier RF power die to the metallic base structure through the second CTE matched mount pad.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention. It being understood that various changes may be made in the function and arrangement of elements described in an example embodiment without departing from the scope of the invention as set forth in the appended claims.

What is claimed is:

1. A radio frequency (RF) package, comprising:
   a first RF power die having a die coefficient of thermal expansion (CTE);
   a high thermal performance substrate, comprising:
   a metallic base structure having a base structure CTE, a frontside facing the first RF power die, and a first die attach region on the frontside of the metallic base structure; and
   a first CTE matched mount pad bonded to the metallic base structure and covering the first die attach region, the first CTE matched mount pad having a mount pad CTE greater than the die CTE and less than the base structure CTE;
   an electrically-conductive bonding material attaching the first RF power die to the first CTE matched mount pad; and
   RF circuitry integrated into first RF power die and electrically coupled to the metallic base structure through the first CTE matched mount pad.

2. The RF package of claim 1, wherein the first CTE matched mount pad projects upwardly from the frontside of the metallic base structure to form a raised pedestal feature to which the first RF power die is mounted.

3. The RF package of claim 1, wherein the metallic base structure comprises an open cavity into which the first CTE matched mount pad is inserted such that the first CTE matched mount pad is at least partially embedded in the metallic base structure.

4. The RF package of claim 1, wherein the first CTE matched mount pad has a die-support surface that is substantially coplanar with an outer terminal surface of the frontside of the metallic base structure.

5. The RF package of claim 1, wherein the first CTE matched mount pad comprises a greater weight percentage of molybdenum and a lesser weight percentage of copper than does the metallic base structure.

6. The RF package of claim 1, wherein the first CTE matched mount pad comprises:
   a first mount pad layer; and
   a second mount pad layer bonded to the first mount pad layer, containing a lesser amount of copper by weight than does the first mount pad layer, and containing a greater amount of molybdenum by weight than does the first mount pad layer.

7. The RF package of claim 6, wherein the first CTE matched mount pad further comprises a third mount pad layer containing a greater amount of copper by weight than does the second mount pad layer and containing a lesser amount of molybdenum by weight than does the second mount pad layer;
   wherein the second mount pad layer is located between first mount pad layer and the second mount pad layer.

8. The RF package of claim 1, wherein the RF circuitry comprises a field effect transistor (FET) having a source terminal electrically coupled to the metallic base structure through the first CTE matched mount pad.

9. The RF package of claim 1, wherein the high thermal performance substrate further comprises a second CTE matched mount pad bonded to the metallic base structure and covering a second die attach region thereon; and
   wherein the RF package further comprises:
   a second RF power die attached to the second CTE matched mount pad; and
   additional RF circuitry formed on the second RF power die and electrically coupled to the metallic base structure through the second CTE matched mount pad.

10. The RF package of claim 9, wherein the first RF power die and the second RF power die comprise a peaking RF power die and a carrier RF power die, respectively.

11. The RF package of claim 10, wherein the first CTE matched mount pad has a first volume; and
   wherein the second CTE matched mount pad has a second volume greater than the first volume.

12. The RF package of claim 1, further comprising a diffusion bond formed between the first CTE matched mount pad and the metallic base structure.

13. The RF package of claim 1, wherein the high thermal performance substrate further comprises a dielectric body in which the metallic base structure and the first CTE matched mount pad are embedded;
   wherein the metallic base structure and the first CTE matched mount pad combine to form an inverted T-shaped structure, which increases in volume moving away from the first RF power die.

14. The RF package of claim 1, further comprising a molded package body encapsulating the first RF power die and at least partially surrounding the high thermal performance substrate;
   wherein the metallic base structure has a backside opposite the frontside and substantially coplanar with a backside of the molded package body.

15. The RF package of claim 1, wherein the high thermal performance substrate further comprises peripheral tie bars extending from the first CTE matched mount pad to a peripheral sidewall of the high thermal performance substrate.

16. The RF package of claim 15, further comprising:
   a second CTE matched mount pad; and
   an intermediate tie bar extending from the first CTE matched mount pad to the second CTE matched mount pad, the intermediate tie bar integrally formed with the first CTE matched mount pad and the second CTE matched mount pad.

17. A method for fabricating a radio frequency (RF) package, the method comprising:
   obtaining a first RF power die having a die coefficient of thermal expansion (CTE);
   attaching the first RF power die to a first CTE matched mount pad included in a high thermal performance substrate, the first CTE matched mount pad bonded to a metallic base structure having a base structure CTE and having a mount pad CTE greater than the die CTE and less than the base structure CTE;
   attaching a carrier RF power die to a second CTE matched mount pad included in the high thermal performance substrate; and
   in conjunction with attaching the first RF power die to the first CTE matched mount pad and attaching the carrier RF power die to the second CTE matched mount pad, electrically coupling power amplifier (PA) circuitry formed on first RF power die to the metallic base structure through the first CTE matched mount pad and electrically coupling RF circuitry formed on carrier RF power die to the metallic base structure through the second CTE matched mount pad.

18. The method of claim 17, wherein the PA circuitry comprises a field effect transistor (FET) having a source terminal; and
   wherein electrically coupling comprises electrically coupling the source terminal of the FET to the metallic base structure through the first CTE matched mount pad.

19. The method of claim 17, further comprising selecting the first CTE matched mount pad to have a layered construction comprising:
   a first mount pad layer; and
   a second mount pad layer bonded to the first mount pad layer, containing a lesser amount of copper by weight than does the first mount pad layer, and containing a greater amount of molybdenum by weight than does the first mount pad layer.

\* \* \* \* \*